US011737263B2

(12) United States Patent
Zhang et al.

(10) Patent No.: US 11,737,263 B2
(45) Date of Patent: Aug. 22, 2023

(54) 3D NAND MEMORY DEVICE AND METHOD OF FORMING THE SAME

(71) Applicant: YANGTZE MEMORY TECHNOLOGIES CO., LTD., Hubei (CN)

(72) Inventors: Ruo Fang Zhang, Wuhan (CN); Enbo Wang, Wuhan (CN); Haohao Yang, Wuhan (CN); Qianbing Xu, Wuhan (CN); Yushi Hu, Wuhan (CN); Fushan Zhang, Wuhan (CN)

(73) Assignee: Yangtze Memory Technologies Co., Ltd., Wuhan (CN)

( * ) Notice: Subject to any disclaimer, the term of this patent is extended or adjusted under 35 U.S.C. 154(b) by 0 days.

(21) Appl. No.: 17/446,006

(22) Filed: Aug. 26, 2021

(65) Prior Publication Data

US 2021/0391347 A1     Dec. 16, 2021

Related U.S. Application Data

(63) Continuation of application No. 16/367,299, filed on Mar. 28, 2019, now Pat. No. 11,145,667, which is a
(Continued)

(51) Int. Cl.
*G11C 5/06* (2006.01)
*H10B 41/27* (2023.01)
(Continued)

(52) U.S. Cl.
CPC .............. *H10B 41/27* (2023.02); *G11C 5/063* (2013.01); *H10B 41/35* (2023.02); *H10B 43/27* (2023.02); *H10B 43/35* (2023.02)

(58) Field of Classification Search
CPC .............. G11C 5/063; H01L 27/11524; H01L 27/11556; H01L 27/1157; H01L 27/11582;
(Continued)

(56) References Cited

U.S. PATENT DOCUMENTS 9,959,932 B1    5/2018   Zhang et al.
2012/0003800 A1   1/2012   Lee et al.
(Continued)

FOREIGN PATENT DOCUMENTS

CN     106653684 A    5/2017
CN     106920772 A    7/2017
(Continued)

OTHER PUBLICATIONS

Korean Office Action dated Oct. 5, 2022 in Korean Patent Application No. 10-2021-7002103, 12 pages.
(Continued)

*Primary Examiner* — Matthew C Landau
*Assistant Examiner* — Dmitriy Yemelyanov
(74) *Attorney, Agent, or Firm* — Oblon, McClelland, Maier & Neustadt, L.L.P.

(57) ABSTRACT

In a three-dimensional memory device, an interconnect structure is formed over a substrate and a first deck is formed over the interconnect structure. The first deck includes alternating first insulating layers and first word line layers, and a first channel structure extending through the first stack. The first channel structure has a first channel dielectric region and a first channel layer. The first channel dielectric region is formed along sidewalls of the first channel structure, positioned over a top surface of the interconnect structure, and in contact with the first insulating layers and the first word line layers. The first channel layer is formed along the first channel dielectric region, and includes a rounded projection that extends away from the top surface of the interconnect structure, extends outwards into the first stack at an interface of the interconnect structure, the first channel structure and the first stack.

10 Claims, 16 Drawing Sheets

Related U.S. Application Data continuation of application No. PCT/CN2018/105442, filed on Sep. 13, 2018.

(51) Int. Cl.
*H10B 41/35* (2023.01)
*H10B 43/27* (2023.01)
*H10B 43/35* (2023.01)

(58) Field of Classification Search
CPC ........ H10B 41/27; H10B 41/35; H10B 43/27; H10B 43/35
See application file for complete search history.

(56) References Cited

U.S. PATENT DOCUMENTS

| | | | |
|---|---|---|---|
| 2012/0112264 A1* | 5/2012 | Lee | H01L 27/11578 257/E27.026 |
| 2015/0008499 A1 | 1/2015 | Lee et al. | |
| 2015/0162342 A1 | 6/2015 | Lee et al. | |
| 2015/0262826 A1 | 9/2015 | Yun et al. | |
| 2016/0005760 A1 | 1/2016 | Lee | |
| 2016/0141301 A1 | 5/2016 | Mokhlesi | |
| 2017/0110474 A1 | 4/2017 | Lee et al. | |
| 2018/0240527 A1 | 8/2018 | Zhang et al. | |

FOREIGN PATENT DOCUMENTS

| | | |
|---|---|---|
| CN | 107359166 A | 11/2017 |
| CN | 107611129 A | 1/2018 |
| CN | 107731835 A | 2/2018 |
| CN | 107871744 A | 4/2018 |
| CN | 108520881 A | 9/2018 |
| CN | 109417072 B | 1/2020 |
| KR | 10-2012-0048415 | 5/2012 |
| TW | 201743435 A | 12/2017 |
| TW | I632645 B | 8/2018 |

OTHER PUBLICATIONS

English translation of the International Search Report and Written Opinion of the International Searching Authority dated Jun. 17, 2019 in PCT/CN2018/105442 filed Sep. 13, 2018, 9 pages.
Office Action dated Aug. 9, 2019 in corresponding Chinese Patent Application No. 201880001699.X, 3 pages.
Combined Chinese Office Action and Search Report dated Dec. 10, 2019, in Patent Application No. 201880001699.X, 5 pages (with English Translation of Category of Cited Documents).
Combined Chinese Office Action and Search Report dated Oct. 10, 2020 in Chinese Patent Application No. 202010112351.7 (with unedited computer generated English translation), 6 pages.
Extended European Search Report dated Jun. 29, 2021, issued in European Patent Application No. 18933226.5.

\* cited by examiner

3D NAND MEMORY DEVICE AND METHOD OF FORMING THE SAME

RELATED APPLICATION

This application is a continuation of U.S. Patent Application Ser. No. 16/367,299 filed on Mar. 28, 2019, which is a continuation of International Application No. PCT/CN2018/105442, filed on Sep. 13, 2018. The entire contents of the above-identified applications are incorporated herein by reference in their entirety.

BACKGROUND

As critical dimensions of devices in integrated circuits shrink to the limits of common memory cell technologies, designers have been looking to techniques for stacking multiple planes of memory cells to achieve greater storage capacity, and to achieve lower costs per bit.

The inventive concepts relate to non-volatile memory devices, and more particularly, to vertical-type 3D NAND memory devices in which channel structures extend in a vertical direction. While the sizes of electronic products may be gradually reduced, there may be demand for the products to perform data processing at higher capacity. Accordingly, an integration degree of semiconductor memory devices used in the electronic products may be increased. One method of increasing the integration degree of semiconductor memory devices may involve non-volatile memory devices having a vertical structure, instead of a planar transistor structure.

Compared to a planar transistor structure, the vertical structure of the 3D NAND memory devices is involved with more critical and complicated manufacturing processes. As the 3D NAND memory devices migrates to configurations with more memory cell layers to achieve higher densities at a lower cost per bit, it becomes an increasing challenge to improve structures and methods for manufacturing the same.

SUMMARY

A 3D NAND memory device can include a plurality of memory cell strings. Each memory cell string can have a plurality of memory cell layers that are separated by a plurality of insulating layers from each other. The plurality of memory cell layers respectively can be a bottom select gate, a top select gate, and a plurality of word lines. The each memory cell string can also have a respective channel structure that is formed to vertically pass through the memory cell layers and the insulating layers. The memory cell layers and the insulating layers are alternatively stacked along sidewalls of the channel structure. As the 3D NAND memory device migrates to configurations with increased memory cell layers to achieve higher densities at a lower cost per bit, more manufacturing challenges are encountered. In one example, it is difficult to etch through the increased memory cell layers based on a conventional dry etching process. A new 3D NAND structure can be implemented that includes a lower deck, an upper deck, and a plurality of inter deck contacts configured to connect the lower deck and the upper deck. The lower deck includes a plurality of lower memory cell strings that are formed over a substrate. Each of the lower memory cell strings includes a plurality of lower memory cell layers and lower insulating layers. The each lower memory cell string also includes a respective lower channel structure that vertically protrudes from a surface of the substrate and passes through the lower memory cell layers and the lower insulating layers. The plurality of inter deck contacts are formed over the lower deck. Each of the plurality of inter deck contacts is connected with a respective lower channel structure. The upper deck includes a plurality of upper memory cell strings that are formed over the inter deck contacts. Each of the upper memory cell strings includes a plurality of upper memory cell layers and upper insulating layers. The each upper memory cell string further includes a respective upper channel structure passing through the upper memory cell layers and upper insulating layers vertically. Each upper channel structure further extends into a respective inter deck contact. A complete memory cell string is therefore formed that includes a lower memory cell string, an upper memory cell string, and an inter deck contact to connect the lower memory cell string and the upper memory cell string.

The upper channel structure can have a circular pillar-shape that has sidewalls and a bottom portion. The upper channel structure can include an upper blocking layer formed along the sidewalls of the channel structure and over the inter deck contact. The upper blocking layer is in direct contact with the upper memory cell layers and the upper insulating layers. The upper channel structure can also include an upper charge storage layer formed over the upper blocking layer, an upper tunneling layer formed over the upper charge storage layer, and an upper channel layer formed over the upper tunneling layer. In some embodiments, the upper channel structure further extends into the inter deck contact by recessing a part of the inter deck contact. The recessed part of the inter deck contact can have sidewalls and a bottom portion. The upper channel structure is in direct contact with the sidewalls and the bottom portion of the recessed part of the inter deck contact. An overlapping region between the inter deck contact and the upper channel structure can be formed in the recessed part of the inter deck contact. The overlapping region has an L-foot shape, and the upper blocking layer is in direct contact with the sidewalls of the recessed part of the inter deck contact.

During an operation of the 3D NAND memory device, a positive voltage is applied to a lowermost upper memory cell layer adjacent to the inter deck contact. Based on a capacitive coupling effect, a fraction of the applied voltage is passed to a part of the upper charge storage layer that is overlapped with the lowermost upper memory layer. The fraction of the applied voltage can repel holes and attract electrons in a part of upper channel layer overlapped with the lowermost upper memory layer. When the fraction of the applied voltage is high enough, the part of the upper channel layer overlapped with the lowermost upper memory layer can be inverted where an inversion layer can be formed at the interface of the upper channel layer and the upper tunneling layer. The inversion layer has depleted holes and gains a low resistance during the operation of the 3D NAND memory device. In the meanwhile, a part of the upper channel layer in the overlapping region may not be inverted due to the existence of the adjacent upper blocking layer, upper charge storage layer and upper tunneling layer along the sidewalls of the overlapping region. Additional parasitic capacitors can be formed near the overlapping region based on the inter deck contact, the upper blocking layer, the upper charge storage layer, the upper tunneling layer, and the upper channel layer along the sidewalls of the overlapping region. The applied voltage in the lowermost memory cell layer correspondingly passes less voltage to a part of the upper charge storage layer in the overlapping interface. The lower amount of voltage coupled to the upper charge storage layer may not be able to invert the part of the upper channel layer in the overlapping region.

In the present disclosure, a novel 3D NAND memory device and a method of forming the same are provided. The upper blocking layer, the upper charge storage layer, and the upper tunneling layer in the overlapping region between the upper channel structure and the inter deck contact are removed and the formation of additional parasitic capacitors are prevented. Consequently, more voltage can be coupled to the charge storage layer so as to invert the adjacent channel layer in the overlapping region to reduce the channel resistance during the operation.

According to an aspect of the present disclosure, a three-dimensional (3D) memory device is provided. The three-dimensional memory device has a substrate, a lower deck formed over the substrate. The lower deck includes a first channel structure that vertically protrudes from a surface of the substrate, and a first memory cell stack that has a plurality of first layers and a plurality of second layers. The first channel structure passes through the first memory cell stack and has sidewalls and a bottom portion. The first layers and the second layers are alternatively stacked along sidewalls of the first channel structure, and a top surface of the first memory cell stack is preferably level with a top surface of the first channel structure.

The three-dimensional memory device also includes an inter deck contact formed over the top surface of the first memory cell stack and connected with the first channel structure. The three-dimensional memory device further includes an upper deck formed over the inter deck contact. The upper deck includes a second channel structure and a second memory cell stack. The second channel structure passes through the second memory cell stack and has sidewalls and a bottom portion. The second channel structure vertically extends into the inter deck contact and further extends laterally into the second memory cell stack at an interface of the inter deck contact and the second memory cell stack. A second channel dielectric region of the second channel structure is above a top surface of the inter deck contact. The second channel dielectric region includes a blocking layer, a charge storage layer, and a tunneling layer. The second memory cell stack has a plurality of third layers and a plurality of fourth layers, and the third layers and the fourth layers are alternatively stacked along sidewalls of the second channel structure. A top surface of the second memory cell stack is preferably level with a top surface of the second channel structure.

According to another aspect of the present disclosure, a method for manufacturing a three-dimensional memory device is provided. In the disclosed method, a lower memory cell string is formed over a substrate. The lower memory cell string includes a plurality of first word lines sequentially stacked over a substrate. The plurality of first word lines are spaced apart from each other by a plurality of first insulating layers. The lower memory cell string also has a first channel structure passing through the plurality of first word lines and the first insulating layers. The first channel structure is formed along a direction perpendicular to the substrate, and coupled with the substrate via a bottom channel contact. An interconnect structure is subsequently formed over the lower memory cell string, and the interconnect structure is connected with the first channel structure. An upper memory cell string is formed over the interconnect structure. The upper memory cell string includes a plurality of second word lines sequentially stacked over the interconnect structure. The plurality of second word lines is spaced apart from each other by a plurality of second insulating layers. The upper memory cell string also includes a second channel structure passing through the plurality of second word lines and second insulating layers. The second channel structure is formed along a direction perpendicular to the substrate. The second channel structure has sidewalls and a bottom portion. In addition, the second channel structure extends into the interconnect structure vertically and extends into a lower-most one of the second insulating layers. A channel dielectric region of the second channel structure is above a top surface of the interconnect structure.

According to yet another aspect of the present disclosure, a memory cell string is provided. The memory cell string includes a lower memory cell string formed over a substrate. The lower memory cell string includes a plurality of first word lines sequentially stacked over a substrate. The plurality of first word lines are spaced apart from each other by a plurality of first insulating layers. The memory cell string also includes a first channel structure passing through the plurality of first word lines and the first insulating layers. The first channel structure is formed along a direction perpendicular to the substrate, and coupled with the substrate via a bottom channel contact. The memory cell string further includes an interconnect structure formed over the lower memory cell string, and the interconnect structure is connected with the first channel structure. In the disclosed memory cell string, an upper memory cell string is formed over the interconnect structure. The upper memory cell string includes a plurality of second word lines sequentially stacked over the interconnect structure. The plurality of second word lines are spaced apart from each other by a plurality of second insulating layers. The memory cell string also includes a second channel structure passing through the plurality of second word lines and the plurality of second insulating layers. The second channel structure is formed along a direction perpendicular to the substrate. The second channel structure has sidewalls and a bottom portion. The second channel structure extends into the interconnect structure vertically and extends into the second insulating layers laterally at an interface of the interconnect structure and the second insulating layers. A second channel dielectric region of the second channel structure is above a top surface of the interconnect structure.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
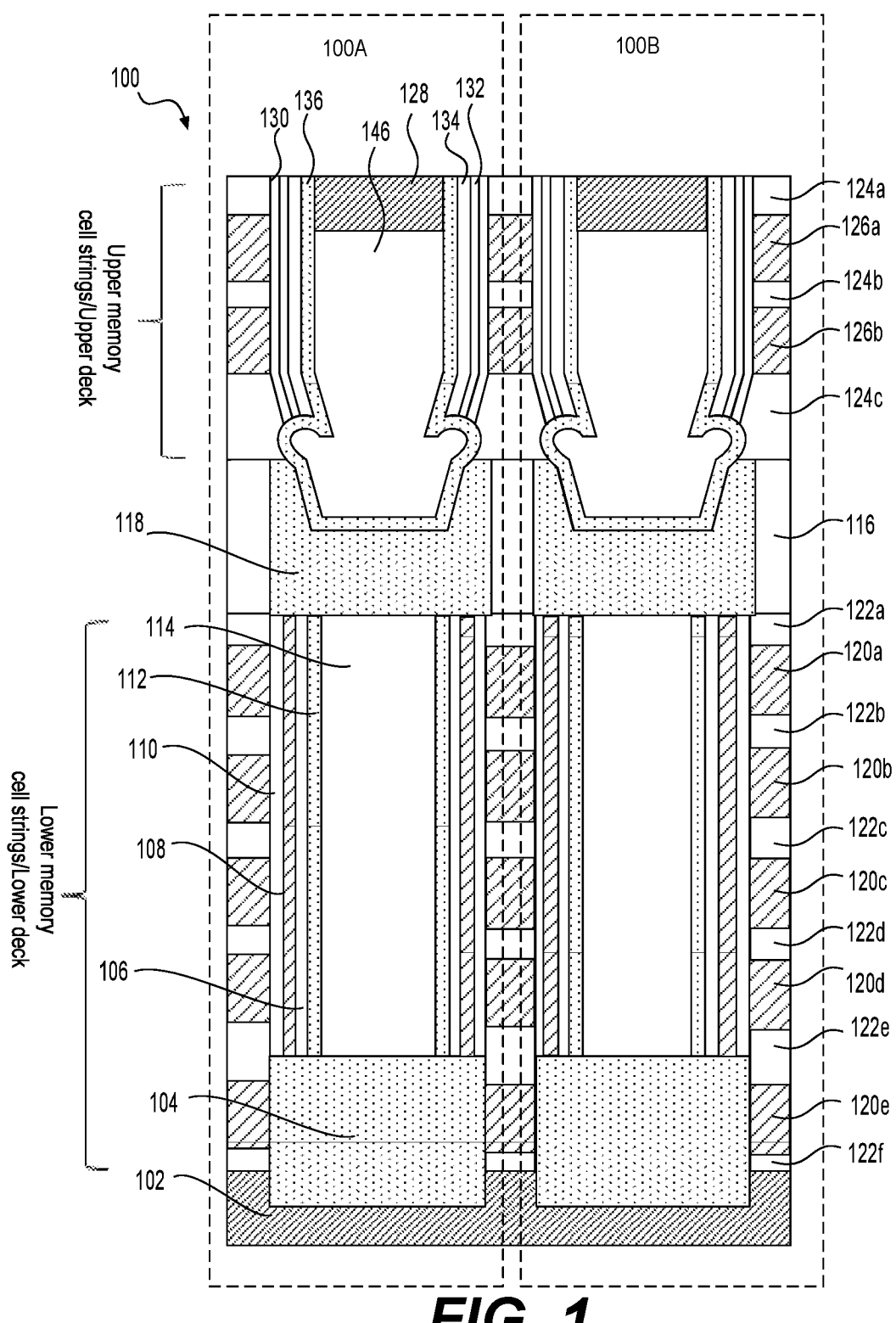
FIG. 1 is a cross-sectional view of a 3D NAND memory device, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed features may be in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 is a cross-sectional view of a 3D NAND memory device 100, in accordance with some embodiments of the present disclosure. The memory device 100 can have a plurality of memory cell strings. For example, two memory cell strings 100A and 100B are included in the memory device 100 as shown in FIG. 1. In some embodiments, the memory cell string 100A is identical to the memory cell string 100B. In some embodiments, the memory cell string 100A can have different dimensions comparing to the memory cell string 100B. In the embodiment of FIG. 1, the memory cell string 100A is identical to the memory cell string 100B. The memory cell string 100A can have a lower memory cell string formed over a substrate 102. The substrate 102 may include a silicon (Si) substrate, a germanium (Ge) substrate, a silicon germanium (SiGe) substrate, and/or a silicon-on-insulator (SOI) substrate. The substrate 102 may include a semiconductor material, for example, a Group IV semiconductor, a Group III-V compound semiconductor, or a Group II-VI oxide semiconductor. In an embodiment of FIG. 1, the substrate 102 is a Group IV semiconductor that may include Si, Ge, or SiGe. The substrate 102 may be a bulk wafer or an epitaxial layer. The lower memory cell string can include a plurality of first word lines 120a-120e sequentially stacked over the substrate 102. Five word lines are shown as an example, and the invention is not limited to this number. The plurality of first word lines 120 are spaced apart from each other by a plurality of first insulating layers 122a-122f. In some embodiments, a first insulating layer 122e can have a larger thickness than other first insulation layers, according to design requirements. In some embodiments, the first word lines 120 illustrated in FIG. 1 are formed using sacrificial layers that are made of SiN. The sacrificial layers can be removed and replaced with a high K layer and a metal layer. The high K layer can be made of aluminum oxide and the metal layer can be made of tungsten (W), for example.

The lower memory cell string of the memory cell string 100A also includes a first channel structure passing through the plurality of first word lines 120 and the first insulating layers 122. The first channel structure can have a circular pillar-shape with sidewalls and a bottom region. Other shapes are possible. The first channel structure is formed along a direction perpendicular to the substrate 102, and coupled with the substrate 102 via a bottom channel contact 104. The first channel structure includes a first channel dielectric region and a channel layer 112. The first channel dielectric region further includes a first blocking layer 110, a first charge storage layer 108, and a first tunneling layer 106. The first blocking layer 110 is formed along the sidewalls of the first channel structure and over the bottom channel contact 104. The first blocking layer 110 is in direct contact with the first word lines 120 and the first insulating layers 122. In an embodiment of FIG. 1, the first blocking layer 110 is made of SiO. The first charge storage layer 108 is formed along the first blocking layer 110 and over the bottom channel contact 104. In an embodiment of FIG. 1, the first charge storage layer 108 is made of SiN. In some embodiments, the first charge storage layer 108 can include a multi-layer configuration, such as a SiN/SiON/SiN multi-layer configuration. The first tunneling layer 106 is formed along the first charge storage layer 108 and over the bottom channel contact 104. In an embodiment of FIG. 1, the first tunneling layer 106 is made of SiO. In some embodiments, the first tunneling layer 106 can include a multi-layer configuration, such as a SiO/SiON/SiO multi-layer configuration. The first channel structure further includes a first channel layer 112 formed along the first tunneling layer 106 and over the bottom channel contact 104. In an embodiment of FIG. 1, the first channel layer 112 is made of polysilicon via a furnace low pressure chemical vapor deposition (CVD) process. A first dielectric layer 114 is formed over the first channel layer 112 to fill the first channel structure.

In some embodiments, the lowermost word line 120e is a bottom select gate (BSG). The bottom channel contact 104 is in direct contact with the lowermost word line 120e. The bottom channel contact 104 further extends into the substrate 102. In some embodiments, the bottom channel contact 104 is made of polysilicon via a selective epitaxially growth technique. In some embodiments, a top surface of the bottom channel contact 104 is above a top surface of the lowermost word line 120e and below a bottom surface of the word line 120d. For example, the top surface of the bottom channel contact 104 can be level with a nearly middle positon between the top surface of word line 120e and the bottom surface of word line 120d.

The memory cell string 100A further has an inter deck contact 118 formed over the lower memory cell string, and the inter deck contact 118 is electrically coupled with the first channel structure via the first channel layer 112. In the embodiment of FIG. 1, the inter deck contact 118 is made of polysilicon. An upper memory cell string (or upper deck) of the memory cell string 100A is formed over the inter deck contact 118 and an inter dielectric layer 116 made of SiO. The upper memory cell string includes a plurality of second word lines 126a-126b made of metal layers sequentially stacked over the inter deck contact 118 and the inter dielectric layer 116. The plurality of second word lines 126 is spaced apart from each other by a plurality of second insulating layers 124a-124c. The number of second word lines 126 can be equal to, less than, or more than the number of first word line 120 based on design requirements. In some embodiments, the word lines 126 illustrated in FIG. 1 can be formed using sacrificial layers that are made of SiN. The sacrificial layers 126 can be removed and replaced with a high K layer and a metal layer. The high K layer can be made of aluminum oxide and the metal layer can be made of W, for example.

The upper memory cell string of the memory cell string 100A includes a second channel structure passing through the plurality of second word lines 126 and the second insulating layers 124 made of SiO. The second channel structure is formed along a direction perpendicular to the substrate. The second channel structure has a circular pillar-shape with sidewalls and a bottom portion. Other shapes are possible. The second channel structure extends into the inter deck contact vertically and also extends into the second insulating layers 124 laterally at an interface of the inter deck contact and the second insulating layers 124. A second channel dielectric region of the second channel structure is above a top surface of the inter deck contact 118. The second channel dielectric region of the second channel structure includes a second blocking layer 130 formed along the sidewalls of second the channel structure. A bottom end of the second blocking layer 130 is above the top surface of the inter deck contact 118. In the embodiment of FIG. 1, the second blocking layer 130 is made of SiO. The second channel dielectric region also includes a second charge storage layer 132 formed over the second blocking layer 130 along the sidewalls of the second channel structure. A bottom end of the second charge storage layer 132 is above the top surface of the inter deck contact 118. In the embodiment of FIG. 1, the second charge storage layer 132 is made of SiN. In some embodiments, the second charge storage layer 132 can include a multi-layer configuration, such as a SiN/SiON/SiN multi-layer configuration. In the second channel dielectric region, a second tunneling layer 134 is formed over the second charge storage layer 132 along the sidewalls of the second channel structure, and a bottom end of the tunneling layer 134 is above the top surface of the inter deck contact 118. In an embodiment of FIG. 1, the second tunneling layer 134 is made of SiO. In some embodiments, the second tunneling layer 134 can include a multi-layer configuration, such as a SiO/SiON/SiO multi-layer configuration.

The second channel structure further includes a second channel layer 136 formed over the second tunneling layer 134 along the sidewalls of the second channel structure, and over the inter deck contact 118. In the embodiment of FIG. 1, the second channel layer 136 is made of polysilicon via a furnace low pressure chemical vapor deposition (CVD) process. The second channel structure also includes a second dielectric layer 146 formed over the second channel layer 136 to fill the second channel structure. The second dielectric layer 146 extends into the inter deck contact 118 and can include SiO, SiN, SiON, SiOCN, or other suitable materials. A top channel contact 128 is formed over the second dielectric layer 146 and connected with the second channel layer 136. A top surface of the top channel contact 128 is preferably level with a top surface of the second channel layer 136. In the embodiment of FIG. 1, the top channel contact 128 is made of polysilicon.

In some embodiments, the first word line 120e can be a bottom select gate and the second word line 126a can be a top select gate based on design requirements.

Figure 2:
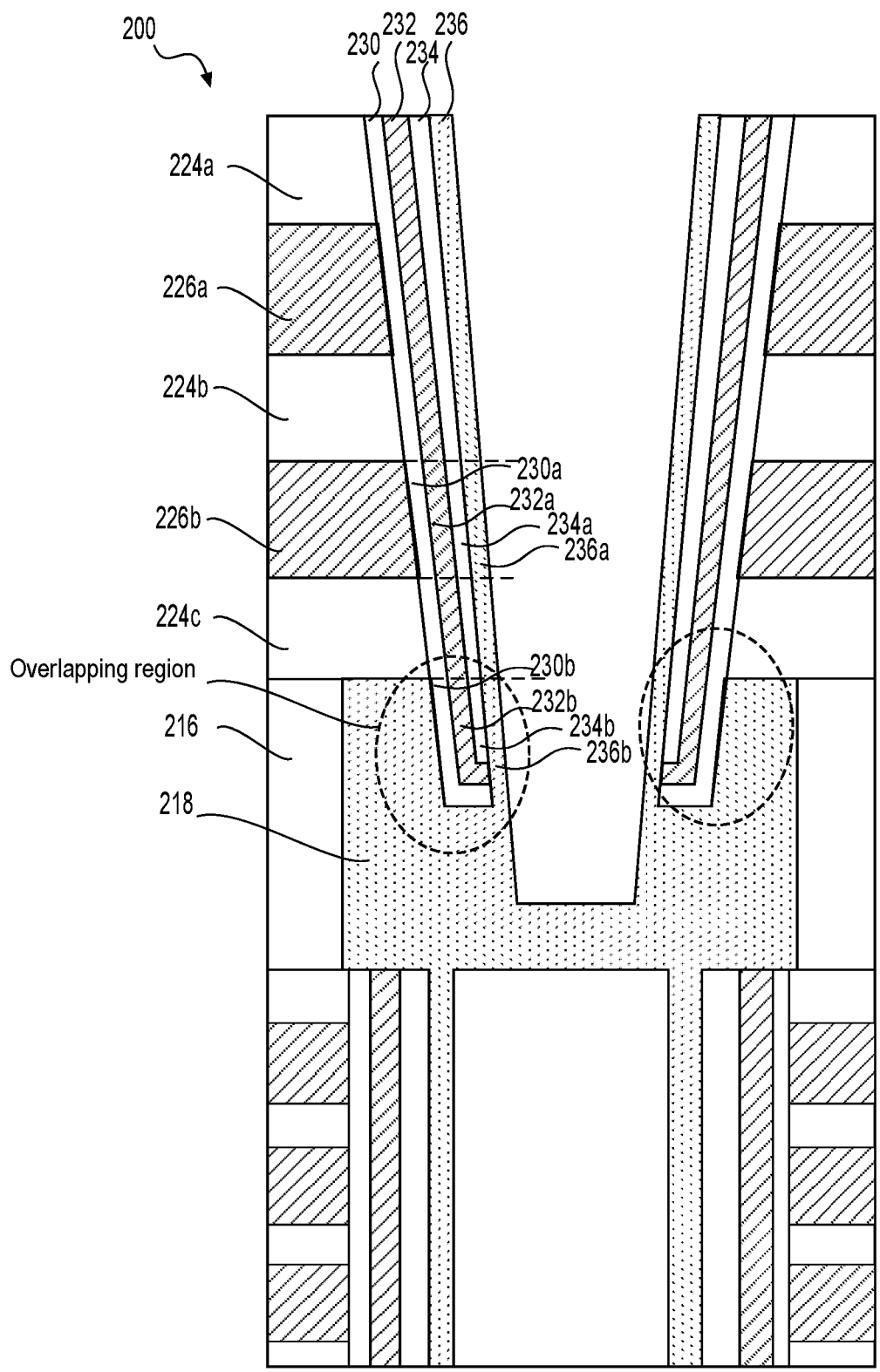
FIG. 2 is a cross-sectional view of a related 3D NAND memory device, in accordance with some embodiments.

FIG. 2 is a cross-sectional view of a related 3D NAND memory device 200, in accordance with some embodiments. During an operation of the related 3D NAND memory device 200, a positive voltage is applied to a lowermost word line (or a lowermost upper memory cell layer) 226b that is adjacent to the inter deck contact 218. Based on capacitive coupling effect, a fraction of the applied voltage is passed to a part of the second charge storage layer 232a that is overlapped with the lowermost word line 226b. The fraction of the applied voltage can repel holes and attract electrons in a part of second channel layer 236a overlapped with the lowermost word line 226b. When the fraction of the applied voltage is enough, the part of the second channel layer 236a overlapped with the lowermost word line 226b can be inverted where an inversion layer can be formed at the interface of the second channel layer 236a and the second tunneling layer 234a. The inversion layer has depleted holes and gains a low resistance during the operation of the 3D NAND memory device. Two parasitic capacitors can be formed, where the lowermost word line 226b, a part of second blocking layer 230a overlapped with the lowermost word line 226b, and the part of the second charge storage layer 232a can form a first capacitor. The first capacitor can be serially connected with a second capacitor that is formed based on the part of the second charge storage layer 232a, a part of the second tunneling layer 234a, and the part of the second channel layer 236a.

In the meanwhile, a part of the second channel layer 236b in an overlapping region between the second channel structure and the inter deck contact 218 may not be inverted due to the existence of a third parasitic capacitor that is formed based on the lowermost word line 226b, the lowermost insulating layer 224c, and the inter deck contact 218. The third capacitor is serially connected with the first capacitor that is formed based on the inter deck contact 218, a part of second blocking layer 230b in the overlapping region, a part of second charge storage layer 232b in the overlapping region, and the second capacitor that is formed based on the part of second charge storage layer 232b in the overlapping region, a part of the second tunneling layer 234b in the overlapping region and the part of the second channel layer 236b in the overlapping region. The applied voltage in the lowermost word line 226b correspondingly passes less voltage to the part of the second charge storage layer 232b in the overlapping region. The lower amount of voltage passed to the second charge storage layer 232b may not be able to invert the part of the second channel layer 236b in the overlapping region.

In the disclosed 3D NAND memory device 100 that is shown in FIG. 1, portions of the second blocking layer 130, the second charge storage layer 132, and the second tunneling layer 134 in the overlapping region of the second channel structure and the inter deck contact are removed and the portion of channel layer 136 in the overlapping region can be inverted to form an inversion layer which in turn reduces the channel resistance during operation.

Figure 3:
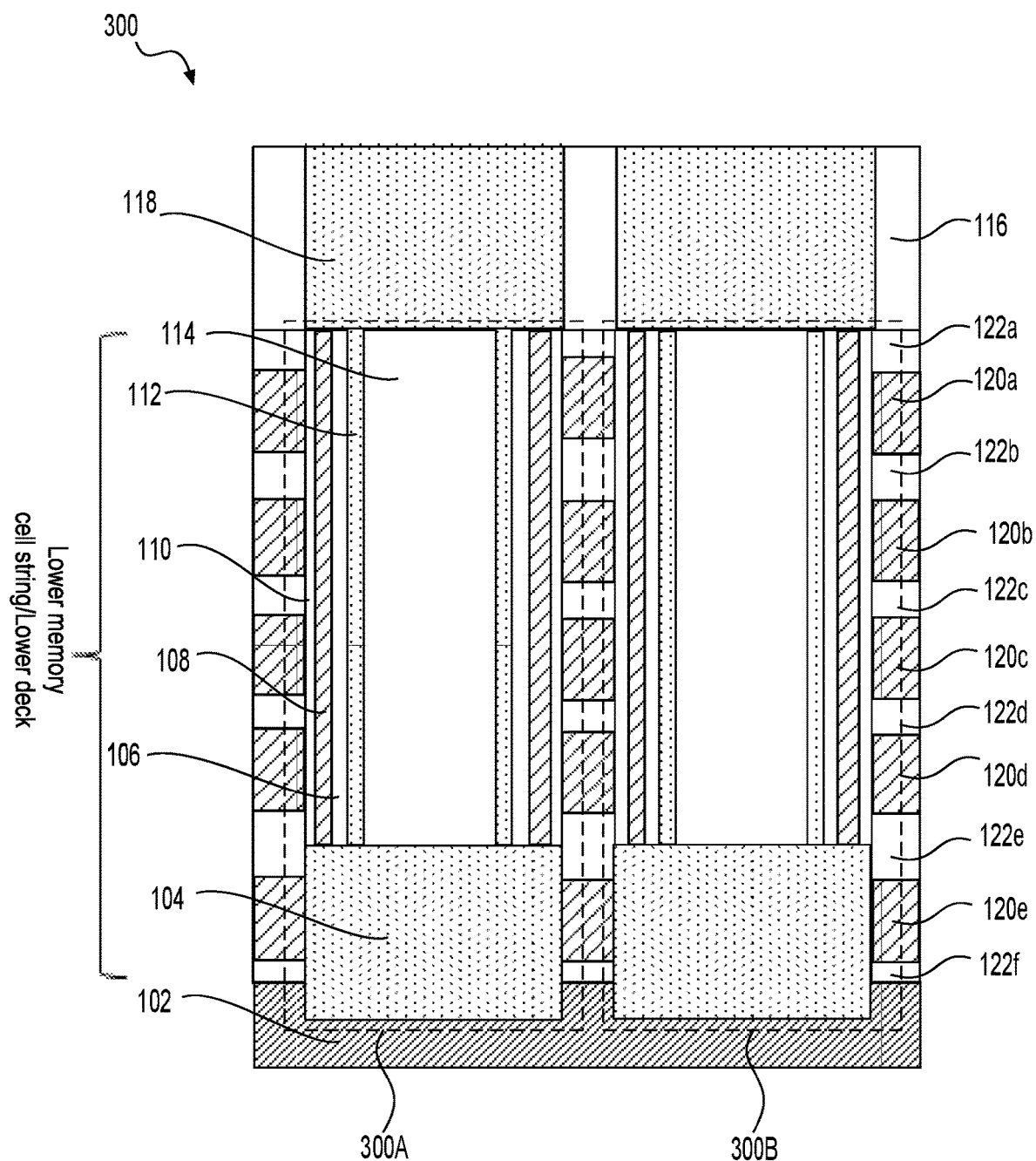
FIGS. 3 through 15 are cross-sectional views of various intermediary steps of manufacturing a 3D NAND memory device in accordance with some embodiments.

FIGS. 3 through 15 are cross-sectional views of various intermediary steps of manufacturing a 3D NAND memory device in accordance with some embodiments. As shown in FIG. 3, a semiconductor structure 300 is prepared through a variety of semiconductor processing techniques, such as photolithography, chemical vapor deposition (CVD), physical vapor deposition (PVD), dry etching, wet etching, wet clean, diffusion, atomic layer deposition (ALD), chemical mechanical planarization (CMP), ion implantation, metrology, or other suitable techniques. The semiconductor structure 300 has a substrate 102. The substrate 102 may include a silicon (Si) substrate, a germanium (Ge) substrate, a silicon germanium (SiGe) substrate, and/or a silicon-on-insulator (SOI) substrate. The substrate 102 may include a semiconductor material, for example, a Group IV semiconductor, a Group III-V compound semiconductor, or a Group II-VI oxide semiconductor. The substrate 102 may be a bulk wafer or an epitaxial layer. In the embodiment of FIG. 3, substrate 102 is a Group IV semiconductor that may include Si, Ge, or SiGe.

The semiconductor structure 300 includes a plurality of lower memory cell strings. Two lower memory cell strings 300A and 300B are included in the semiconductor structure 300 as shown in FIG. 3, for example. In some embodiments, the lower memory cell string 300A is identical to the lower memory cell string 300B. In some embodiments, the lower memory cell string 300A can have different dimensions compared to the lower memory cell string 300B. In the embodiment of FIG. 3, the lower memory cell string 300A is identical to the lower memory cell string 300B. The lower memory cell string 300A includes a plurality of first word lines 120a-120e sequentially stacked over the substrate 102. The plurality of first word lines 120 are spaced apart from each other by a plurality of first insulating layers 122a-122f. In some embodiments, the word lines 120 illustrated in FIG. 3 can be sacrificial layers that are made of SiN. The sacrificial layers can be removed and replaced with a high K layer and a metal layer. The high K layer can be made of aluminum oxide and the metal layer can be made of W, for example.

The lower memory cell string 300A is substantially similar to the lower memory cell string discussed above with reference to FIG. 1. For example, a first channel structure of the lower memory cell string 300A passes through the plurality of first word lines 120 and a plurality of first insulating layers 122. The first channel structure is electrically coupled with the substrate 102 via a bottom channel contact 104. The first channel structure can have a first channel layer 112, a first tunneling layer 106, a first charge storage layer 108, a first blocking layer 110, and a first dielectric layer 114. The semiconductor structure 300 further has a plurality of inter deck contacts. Each of the plurality of inter deck contacts is formed over a respective lower memory cell string and electrically coupled with a first channel structure of the respective lower memory cell string. As shown in FIG. 3, an inter deck contact 118 is formed over the lower memory cell string 300A and electrically coupled with the lower memory cell string 300A via the first channel layer 112. In an embodiment of FIG. 3, the inter deck contact 118 is made of polysilicon via a low pressure CVD process. The inter deck contact 118 can be formed by introducing an inter dielectric layer 116 over the lower memory cell strings 300A. An inter deck contact opening (not shown) can be patterned in the inter dielectric layer 116. The inter deck contact opening can have sidewalls and a bottom portion that exposes the first channel structure. A polysilicon layer is deposited via a lower pressure CVD process along the sidewalls of the inter deck contact opening and over the first channel structure. The polysilicon layer covers a top surface of the inter dielectric layer 116. A subsequent surface planarization process, such as a chemical mechanical polishing (CMP), is performed to remove excessive polysilicon layer over the top surface of the inter dielectric layer 116.

Figure 4:
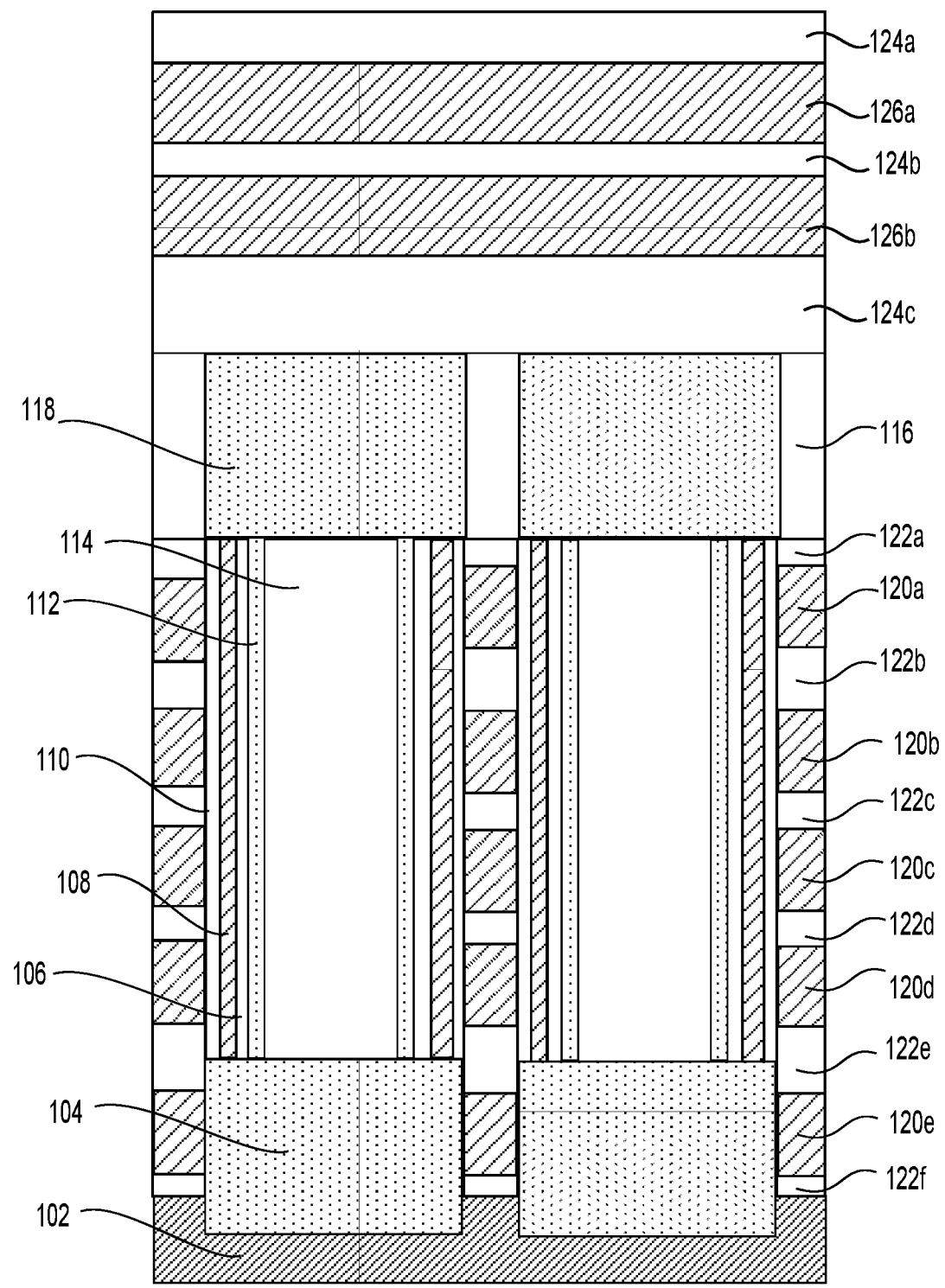

In FIG. 4, a plurality of second word lines 126a-126b and a plurality of second insulating layers 124a-124c can be formed over the inter deck contact 118 and the inter dielectric layer 116. The plurality of second word lines 126a-126b are sequentially stacked over the inter deck contact 118 and spaced apart from each other by the plurality of second insulating layers 124a-124c, where the lowermost second insulating layer 124c is in direct contact with the inter deck contact 118 and the inter dielectric layer 116. The number of the second word lines 126 can be equal to, less than, or more than the number of the first word line 120 based on design requirements. In some embodiments, the word lines 126 illustrated in FIG. 4 are formed using sacrificial layers that are made of SiN. The sacrificial layers 126 can be removed and replaced with a high K layer and a metal layer. The high K layer can be made of aluminum oxide and the metal layer can be made of W, for example. The second word lines 126 can further includes polysilicon, WSix, SiC, SiON, SiOC, SiCN, SiOCN, AlON, or other suitable materials. The second word lines 126 can have a thickness in a range from 20 nm to 50 nm. Any suitable deposition process can be applied to form the word lines 126, such as chemical vapor deposition (CVD), physical vapor deposition (PVD), atomic layer deposition (ALD), diffusion, or any combination thereof. The second insulating layers 124 can include SiO, AlO, ZrO, or other suitable materials with a thickness between 20 nm and 40 nm. The second insulating layers 124 can be formed by performing one or more of vapor deposition (CVD), physical vapor deposition (PVD), atomic layer deposition (ALD), diffusion, or any combination thereof.

Figure 5:
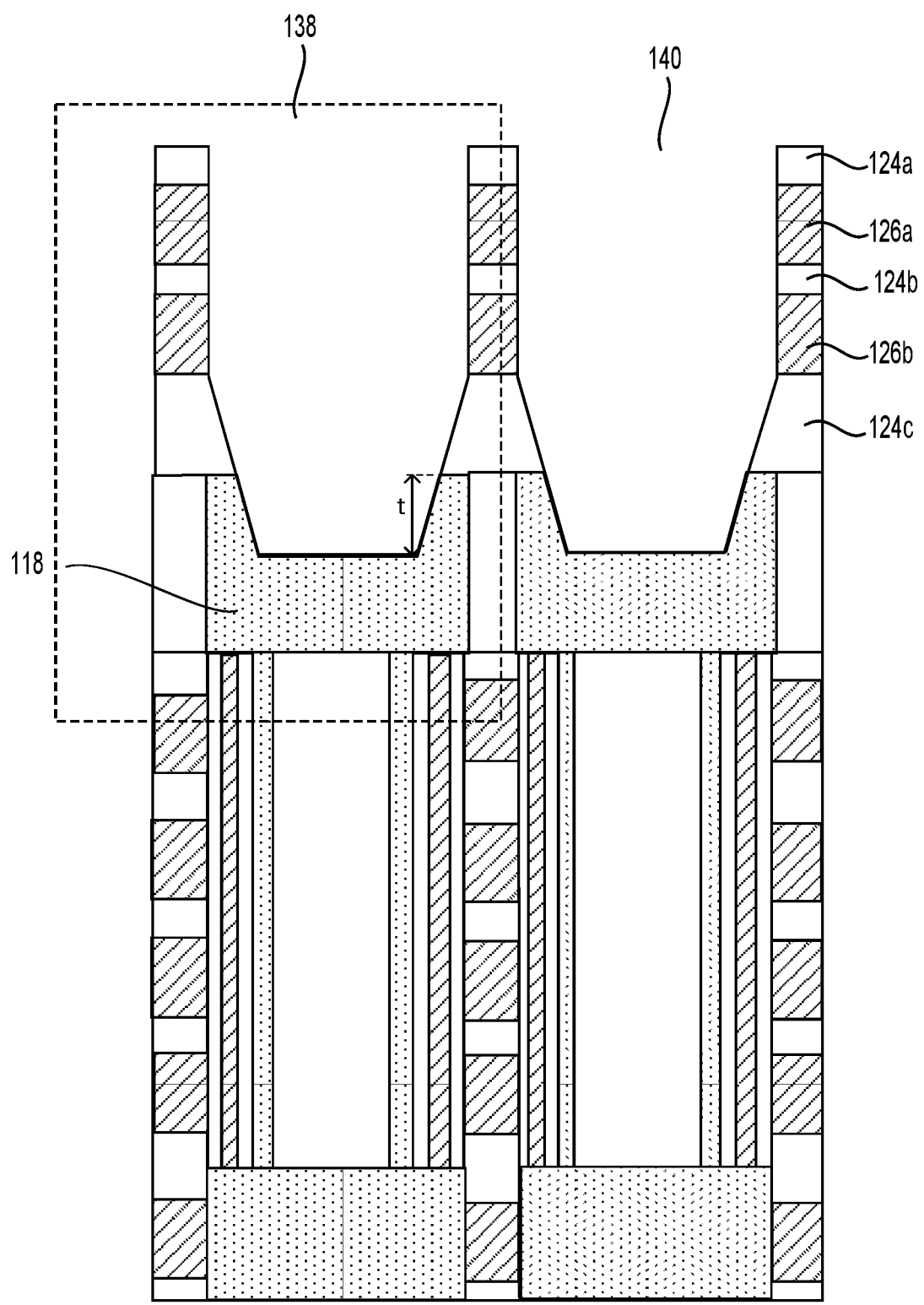

In FIG. 5, a plurality of channel openings can be formed. For example, two channel openings 138 and 140 are included in FIG. 5. The channel openings pass through the second word lines 126 and the second insulating layers 124 and extend into the inter deck contacts 116 and 118 by recessing a portion of the inter deck contact. In some embodiments, the recessed portion of the inter deck contact can have a depth of t. The depth of t can have a range from 20 nm to 60 nm based on technology requirements. The channel openings can have a top critical dimension (CD) in a range from 60 nm to 100 nm and a bottom CD in a range from 50 nm to 70 nm. As shown in FIG. 5, the channel openings can have a tapered profile where the bottom CD is smaller than top CD. A tapered profile can help the subsequent deposition step and improve the sidewall coverage. The tapered profile can be obtained by taping the mask profile or adjusting the etching recipe (e.g., introducing sidewall deposition) during the plasma etching process. In order to form the channel openings, a patterned mask stack can be formed over the uppermost insulating layer 124a. The mask stack can include one or more hard mask layers and a photoresist layer. The mask stack can be patterned according to any suitable technique, such as a lithography process (e.g., photolithography or e-beam lithography) which may further include photoresist coating (e.g., spin-on coating), soft baking, mask aligning, exposure, post-exposure baking, photoresist developing, rinsing, drying (e.g., spin-drying and/or hard baking), and the like. When the patterned mask stack is formed, an etching process, such as a wet etching or a dry etching, can be applied. The etching process can transfer the patterns of the mask stack into the second word lines 126 and the second insulating layers 124. The etching process etches through the second word lines 126 and the second insulating layers 124. The etching process further extends into the inter deck contact by recessing a portion of the inter deck contact to form the channel openings 138 and 140. A subsequent plasma ashing and a wet clean can be applied to remove the remaining mask stack. The openings 138 and 140 can have a circular pillar-shape with sidewalls and a bottom portion to expose the inter deck contacts. However, the present disclosure is not limited thereto, and the channel openings may be formed in a square pillar-shape, an oval pillar-shape, or other suitable shapes.

In order to make the whole disclosure clear and concise, subsequent description is made based on the channel opening 138. The description is applicable to channel opening 140.

Figure 6:
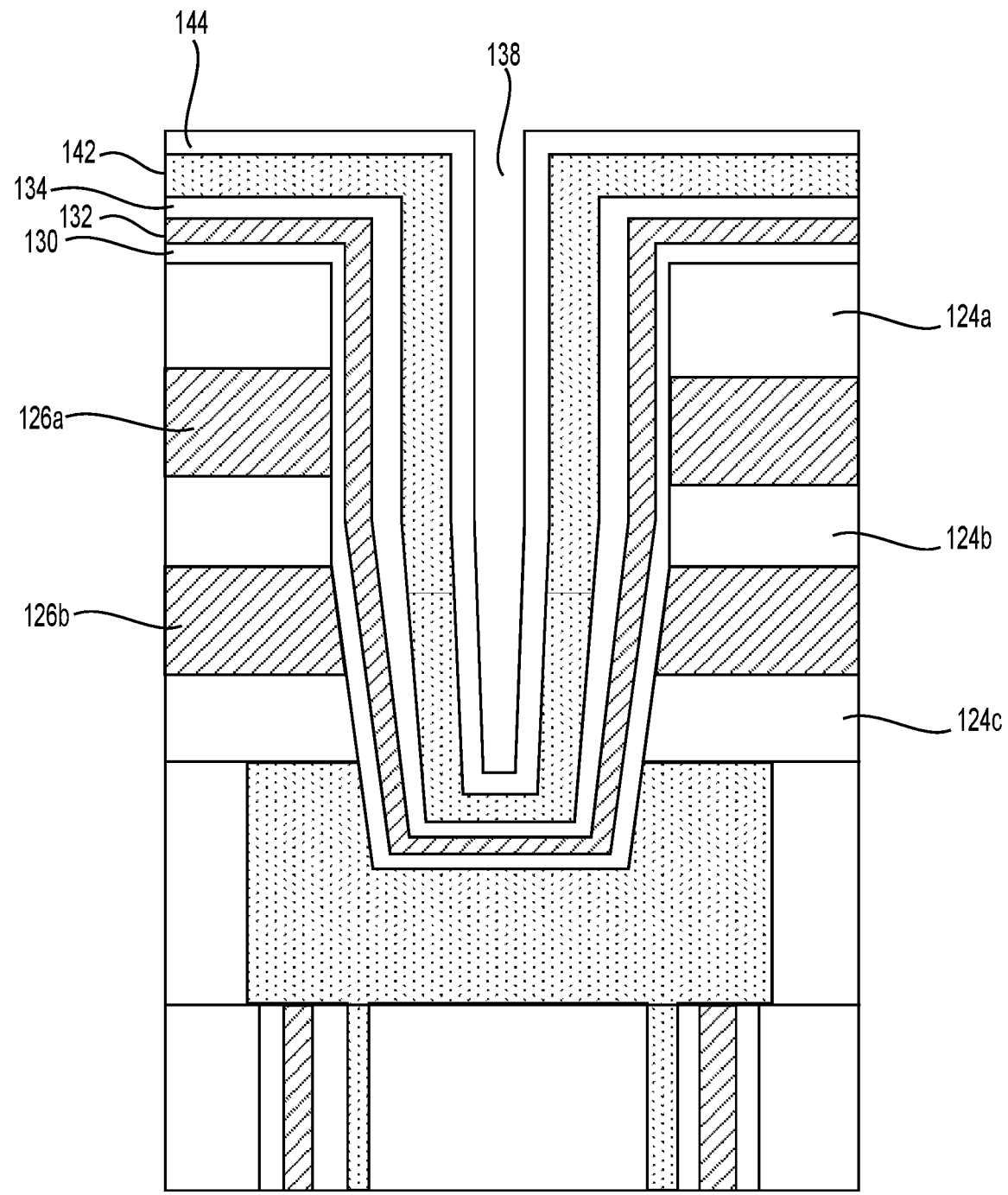

In FIG. 6, a second channel dielectric region is formed. The second channel dielectric region includes a second blocking layer 130, a second charge storage layer 132, and a second tunneling layer 134. The second blocking layer 130 is formed along the sidewalls of the channel opening 138 and over the inter deck contact 118. The second blocking layer 130 further covers a top surface of the uppermost second insulating layer 124a. The second blocking layer 130 can be made of SiO with a thickness between 1 nm and 10 nm. The second blocking layer 130 can be formed by performing one or more of vapor deposition (CVD), physical vapor deposition (PVD), atomic layer deposition (ALD), diffusion, or any combination thereof. In some embodiments, the second blocking layer 130 can be made by oxidizing a pre-formed SiN layer via an in situ steam generation (ISSG) process with a thickness between 1 nm and 10 nm. Over the second insulating layer 130, the second charge storage layer 132 is formed. The second charge storage layer 132 can be made of SiN. In some embodiments, the second charge storage layer 132 can have a single layer or multi-layer configurations. The thickness of the second charge storage layer 132 can range from 3 nm to 10 nm based on technology requirements. Any suitable deposition process can be applied to form the second charge storage layer 132, such as chemical vapor deposition (CVD), physical vapor deposition (PVD), atomic layer deposition (ALD), diffusion, or any combination thereof. The second tunneling layer 134 is subsequently formed over the second charge storage layer 132 in the channel opening 138. The second tunneling layer 134 can be made of SiO. The second tunneling layer 134 can also have a single layer or multi-layer configurations, such as a SiO/SiON/SiO multi-layer configuration. The second tunneling layer 134 can have a thickness from 1 nm to 5 nm based on design requirements. The second tunneling layer 134 can be formed by performing one or more of vapor deposition (CVD), physical vapor deposition (PVD), atomic layer deposition (ALD), diffusion, or any combination thereof. In an embodiment of FIG. 6, a total thickness of the second blocking layer 130, the second charge storage layer 132 and the second tunneling layer 134 can range from 15 nm to 25 nm according to design requirements.

A channel layer 142 is further formed over the second tunneling layer 134. The channel layer 142 can be made of polysilicon via a furnace low pressure CVD process with a thickness between 5 nm and 15 nm. Comparing with related examples, the channel layer 142 is formed with a larger thickness to help the subsequent etching process. Other suitable deposition processes can be applied to form the channel layer 142, such as physical vapor deposition (PVD), atomic layer deposition (ALD), diffusion, or any combination thereof. The channel layer 142 can have an annular shape with sidewalls and a bottom portion in the channel opening 138. The channel layer 142 can also have a top portion that covers the top surface of the uppermost insulating layer 124a. Over the channel layer 142, a protective layer 144 can be formed. The protective layer 144 can be made of SiO with a thickness from 3 nm to 10 nm. Comparing with related examples, the protective layer 144 is formed with a bigger thickness to help the subsequent etching process. Any suitable deposition process can be applied to form the protective layer 144, such as chemical vapor deposition (CVD), physical vapor deposition (PVD), atomic layer deposition (ALD), diffusion, or any combination thereof. The protective layer 144 can have an annular shape with sidewalls and a bottom portion in the channel opening 138. The protective layer 144 can also have a top portion that covers the top surface of the uppermost insulating layer 124a.

Figure 7:
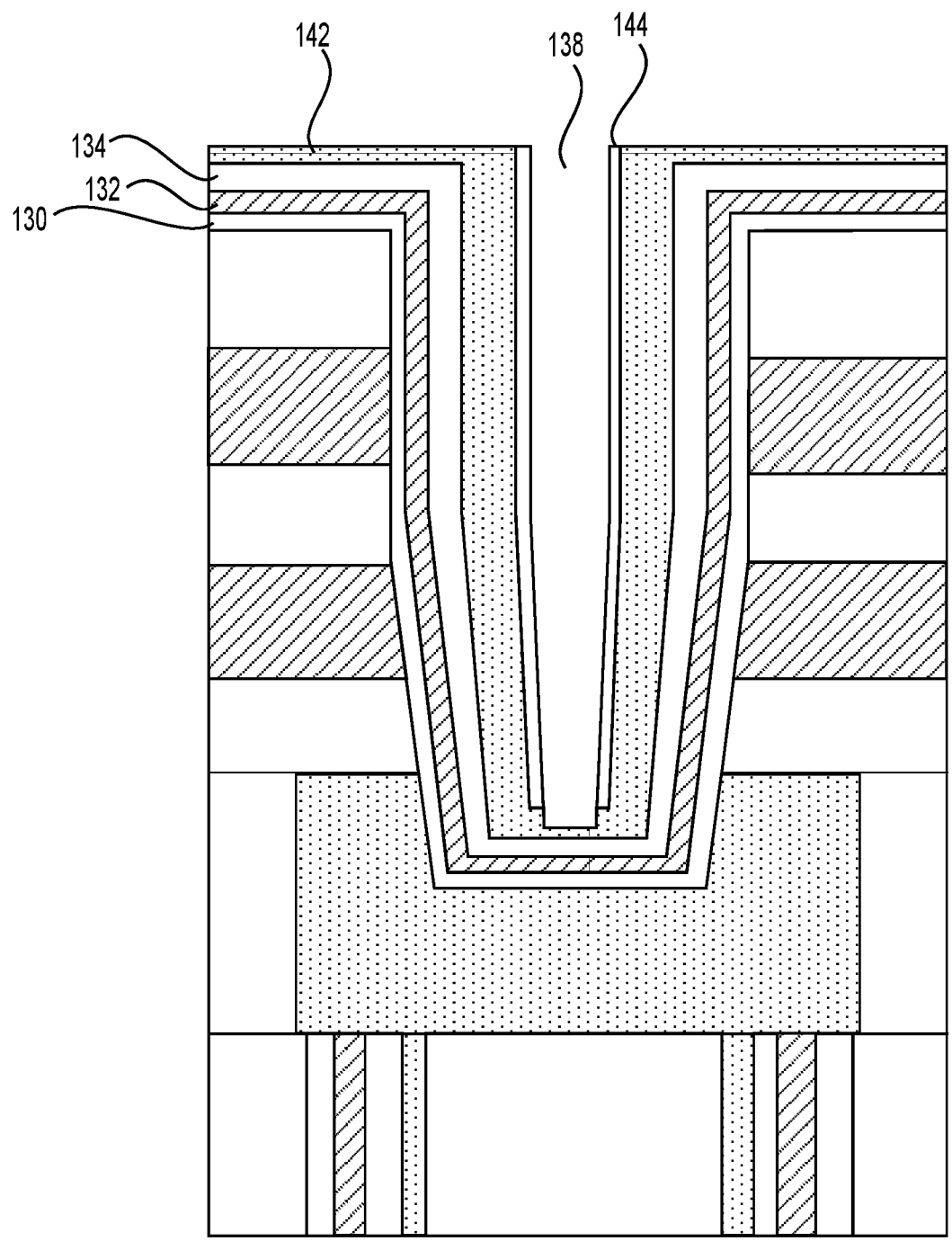

In FIG. 7, a plasma punch (or plasma etch) can be introduced where the bottom portion of the protective layer 144 in the channel opening 138 is removed to expose the bottom portion of the channel layer 142. The plasma punch further recesses the bottom portion of the channel layer 142. When the plasma punch is completed, the top portion of the protective layer 144 can be removed and the top portion of the channel layer 142 can be reduced. As mentioned above, a thicker channel layer 142 is introduced at the present disclosure. The thicker channel layer 142 prevents the plasma punch from punching through the channel layer 142 to damage underneath second tunneling layer at the bottom portion of the channel opening 138. In addition, the top portion of the channel layer 142 can serve as additional mask layer to reduce consumption of the top hard mask layer. The thicker protective layer 144 mentioned above prevents the plasma from attacking the sidewalls of the channel layer 142 and the second tunneling layer 134 during the plasma punch.

Figure 8:
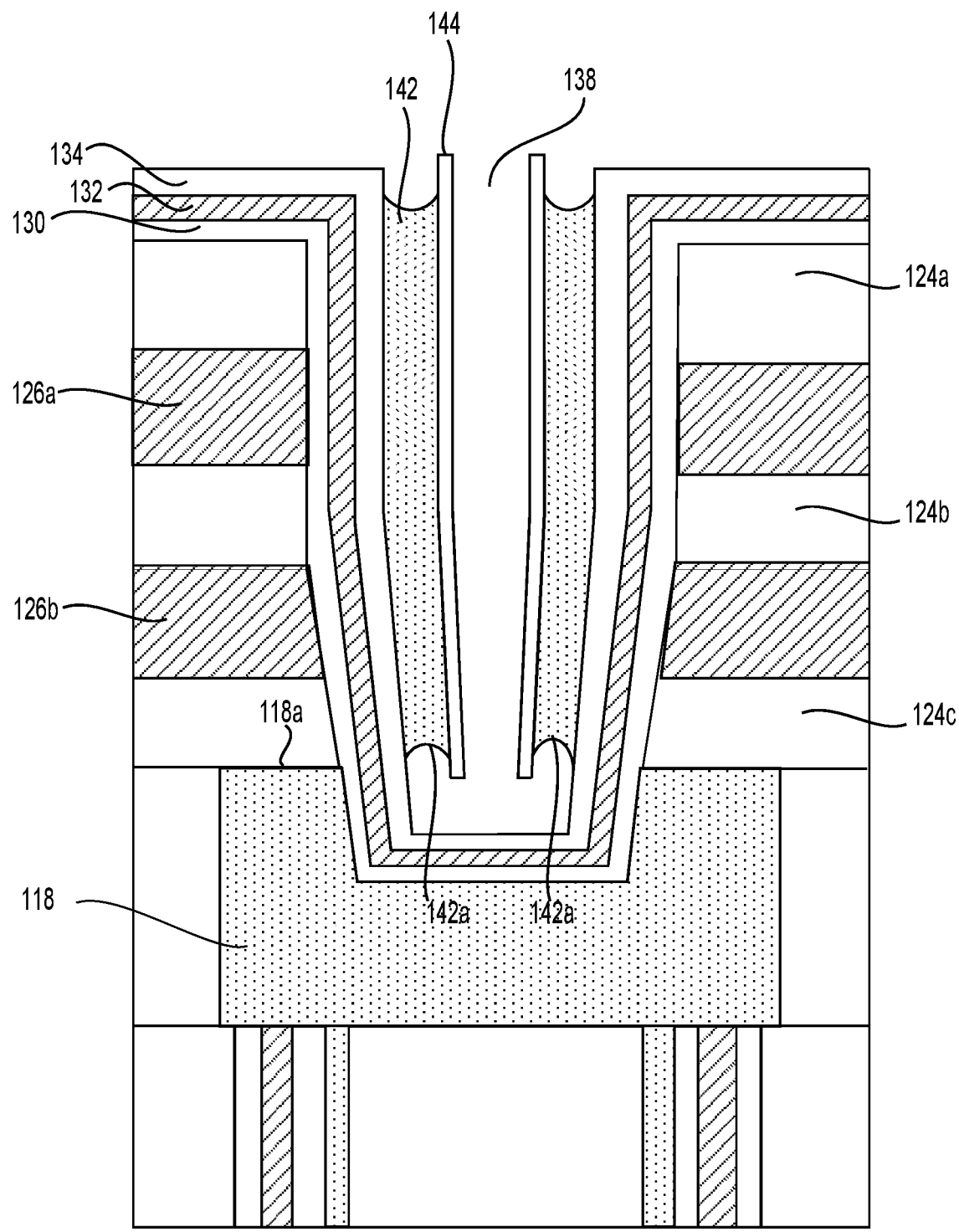

In FIG. 8, a wet etching process can be introduced to remove the top portion and the bottom portion of the channel layer 142. For example, a wet solution of tetramethyl ammonium hydroxide (TMAH) can be applied to remove the top portion and the bottom portion of the channel layer 142. During the wet etching, the sidewalls of the channel layer 142 still remain because the protective layer 144 prevents the wet solution from reacting with the channel layer 142. As mentioned above, the thickness of the protective layer 144 is increased so as to improve the isolation between the channel layer 142 and the wet solution. Other suitable chemicals, such as ammonium hydroxide, can also be applied to remove the channel layer 142. The wet etching process can be precisely controlled to obtain a desired profile where a bottom end 142a of the channel layer 142 is above the top surface 118a of the inter deck contact 118.

Figure 9:
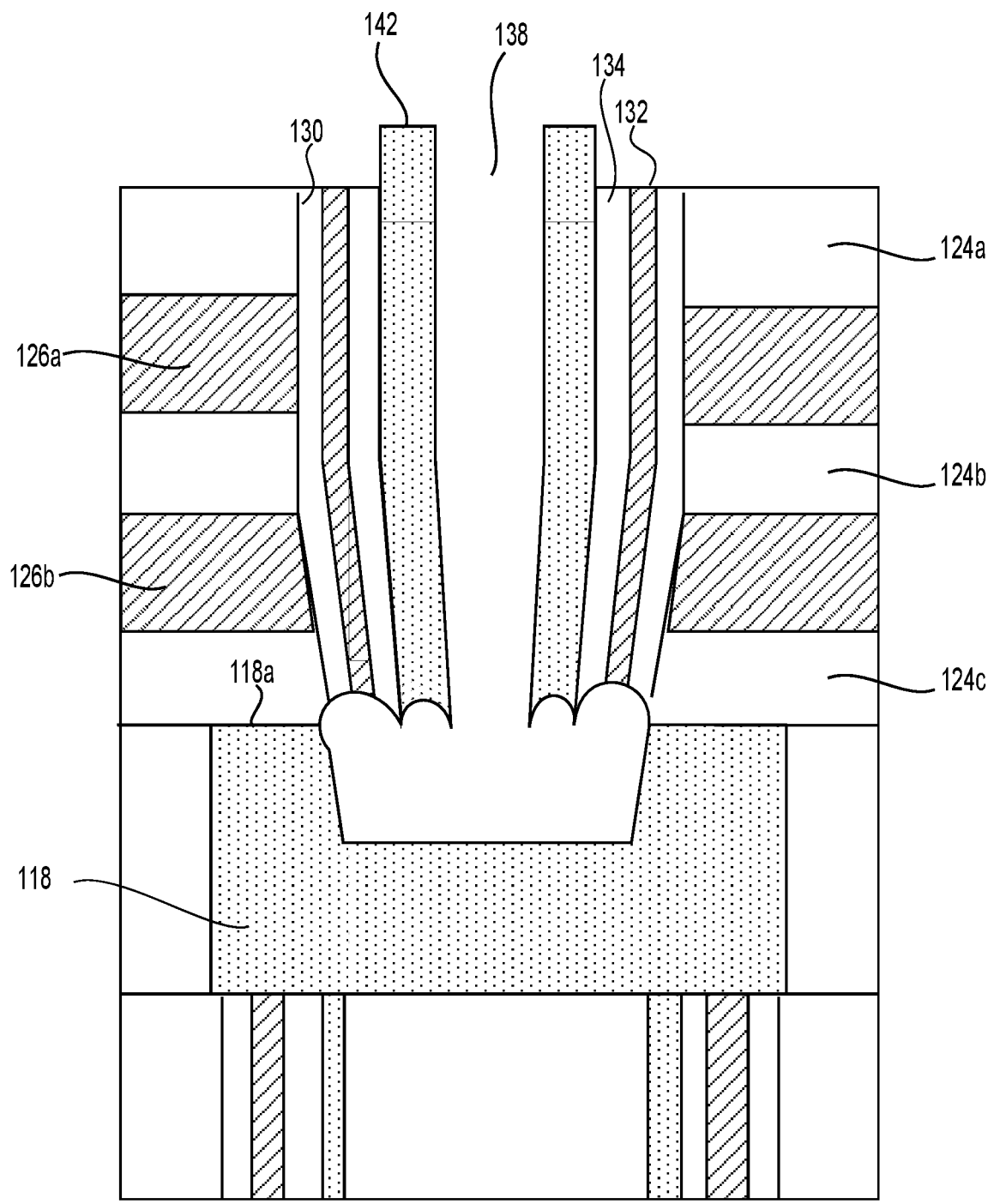

In FIG. 9, a plasma etching process can be introduced. The plasma etching process can be an inductively coupled plasma (ICP) etching process, a reactive ion etching process, or other suitable plasma etching process. The plasma etching process can apply a fluorine based etching gas, such as $CF_4$, $NF_3$, $CHF_3$, or other suitable etching gases. The plasma etching can selectively remove portions of the second blocking layer 130, the second charge storage layer 132, and the second tunneling layer 134 while attacking very little of channel layer 142. During the plasma etching, the protective layer 144 can be removed completely. A top portion of the second blocking layer 130, the second charge storage layer 132, and the second tunneling layer 134 over the uppermost second insulating layer 124a can be removed fully. In addition, the plasma etching process removes bottom portions of second blocking layer 130, the second charge storage layer 132, and the second tunneling layer 134. The plasma etching process further removes a part of the sidewalls of the second blocking layer, the second charge storage layer, and the second tunneling layer in the overlapping region of the channel opening and the inter deck contact. The plasma etching process can further extend into the second insulating layer 124c at an interface between the inter deck contact 118 and the second insulating layer 124c. Upon the completion of the plasma etching process, bottom ends of the second blocking layer 130, the second charge storage layer 132, and the second tunneling layer 134 are above the top surface of the inter deck contact 118a. In addition, top surfaces of layers 130, 132, 134 and 124a can be coplanar, and a top surface of the channel layer 142 is above the top surfaces of layers 130, 132, 134 and 124a after the plasma etching process.

Figure 10:
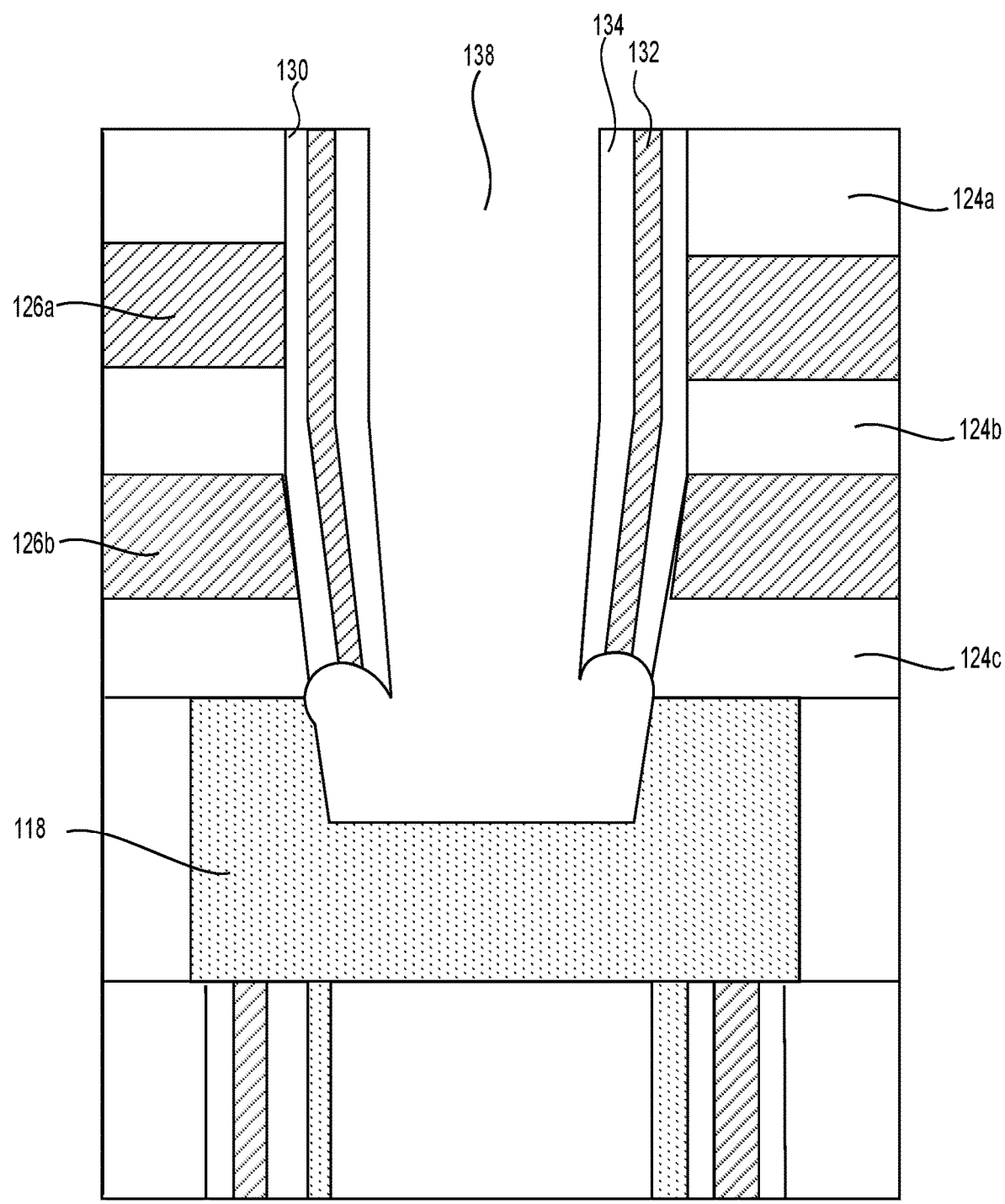

In FIG. 10, the remaining channel layer 142 is removed via a wet etching process. For example, a wet solution of ammonium hydroxide can be introduced to selectively remove the channel layer 142 while attacking very little of the adjacent layers.

Figure 11:
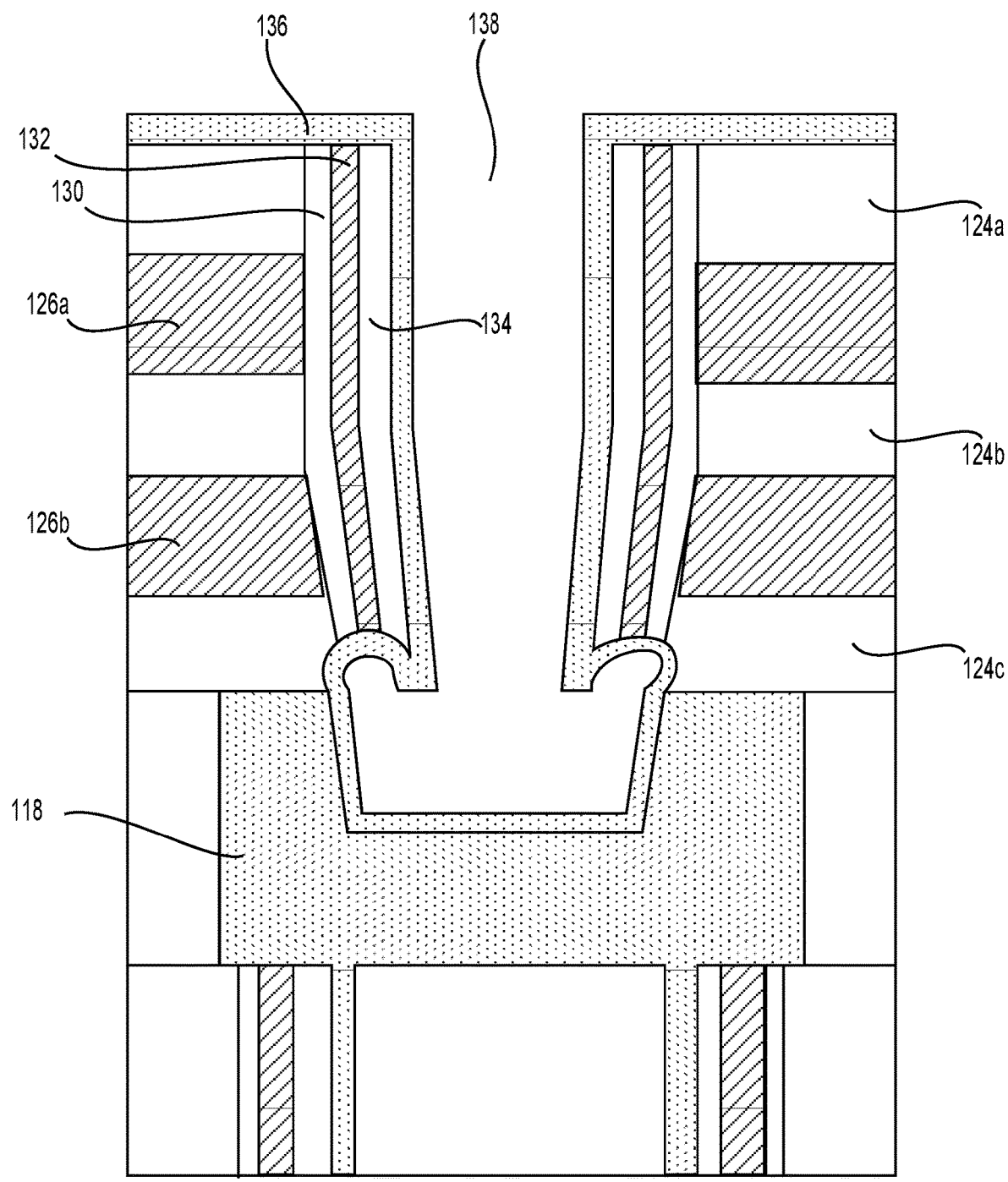

In FIG. 11, the second channel layer 136 is formed. The second channel layer 136 can be made of polysilicon via a furnace low pressure CVD process. Of course, other suitable deposition process can be applied to form the second channel layer 136, such as chemical vapor deposition (CVD), physical vapor deposition (PVD), atomic layer deposition (ALD), diffusion, or any combination thereof. The thickness of the second channel layer 136 can be between 2 nm and 8 nm. The second channel layer 136 can be formed over the second tunneling layer 134 along the sidewalls of the channel opening 138. The second channel layer 136 further covers the top surface of the uppermost second insulating layer 124a and the inter deck contact 118. Upon the formation of the second channel layer 136, the recessed part of the inter deck contact 118 can be covered with the second channel layer 136, and a part of the sidewalls of the channel opening 138 extending into the lowermost insulating layer 124c can also be covered with the second channel layer 136.

Figure 12:
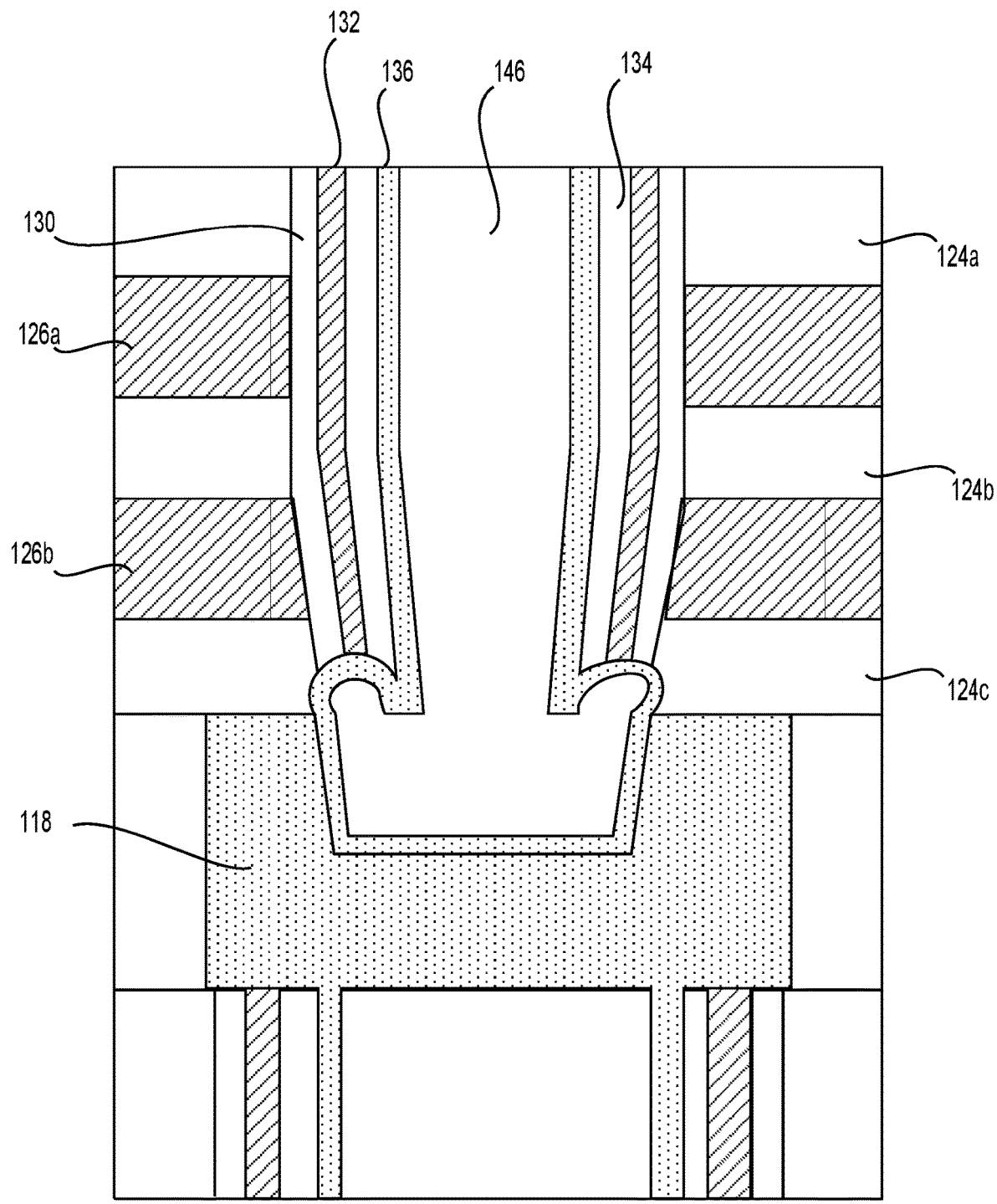

In FIG. 12, a second dielectric layer 146 can be formed over the second channel layer 136. The second dielectric layer 146 further covers the top surface of the uppermost second insulating layer 124a. The second dielectric layer 146 can fill the channel opening 138 and extend into the inter deck contact 118. The second dielectric layer 146 can include SiO, SiN, SiON, SiOCN, or other suitable materials. The second dielectric layer 146 can be formed by performing one or more of vapor deposition (CVD), physical vapor deposition (PVD), atomic layer deposition (ALD), diffusion, or any combination thereof. A subsequent surface planarization process can be performed to remove any excessive second channel layer 136 and any excessive second dielectric layer 146 over the top surface of the uppermost second insulating layer 124a. A final profile can be shown in FIG. 12 where top surfaces of the second dielectric layer 146, the second channel layer 136, the second tunneling layer 134, the second charge storage layer 132, the second blocking layer 130, and the uppermost second insulating layer 124a are coplanar.

Figure 13:
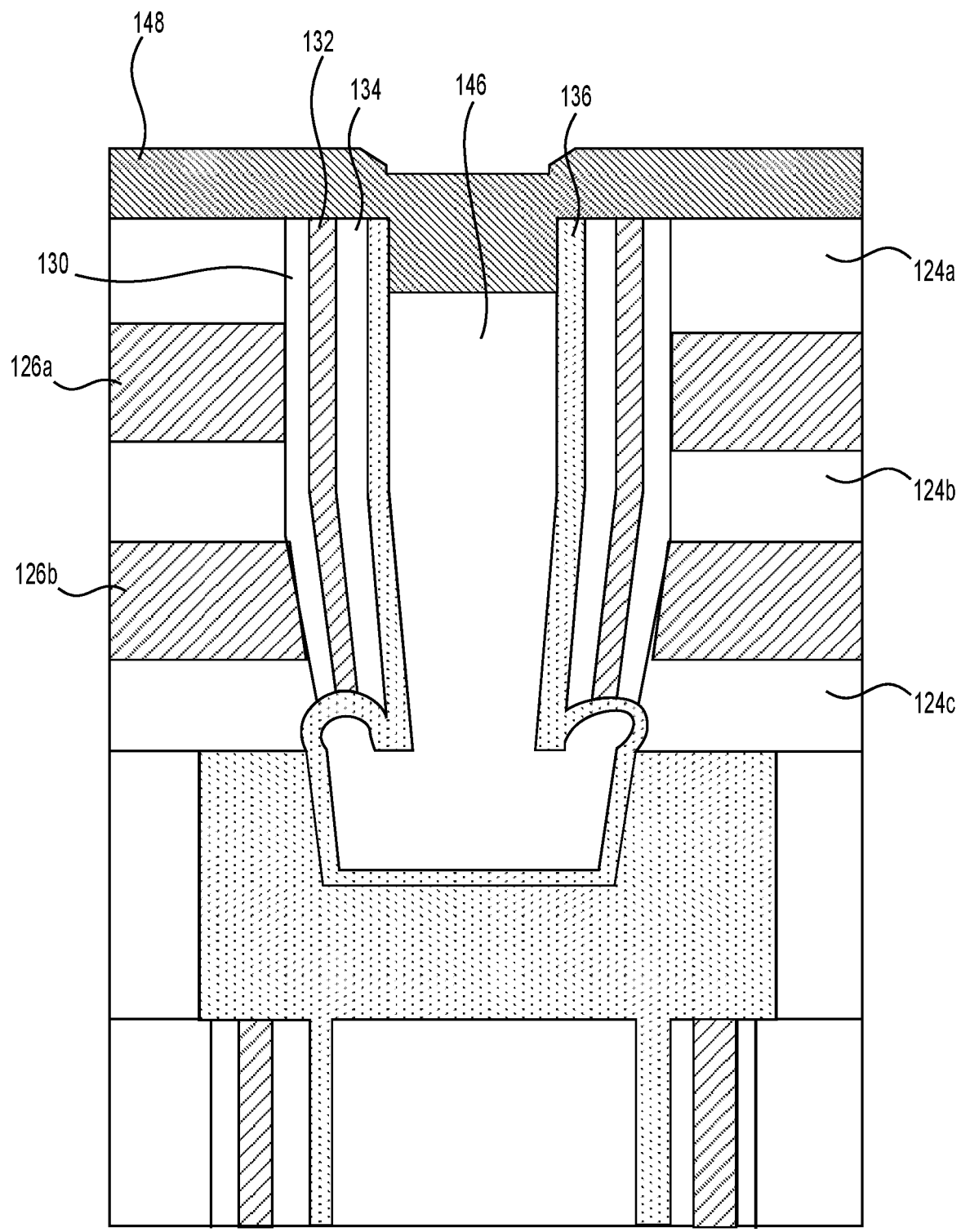

In FIG. 13, a top portion of the second dielectric layer 146 can be recessed by a photolithography patterning process and a subsequent etching process. A channel contact layer 148 is subsequently formed to fill the recessed portion of the second dielectric layer 146. The channel contact layer 148 can further cover the top surface of the uppermost second insulating layer 124a. The channel contact layer 148 can include polysilicon, W, TiN, Ti, or other suitable materials. The channel contact layer 148 can be formed by performing one or more of vapor deposition (CVD), physical vapor deposition (PVD), atomic layer deposition (ALD), diffusion, or any combination thereof. The contact layer 148 can have a thickness from 20 nm to 100 nm based on design requirements.

Figure 14:
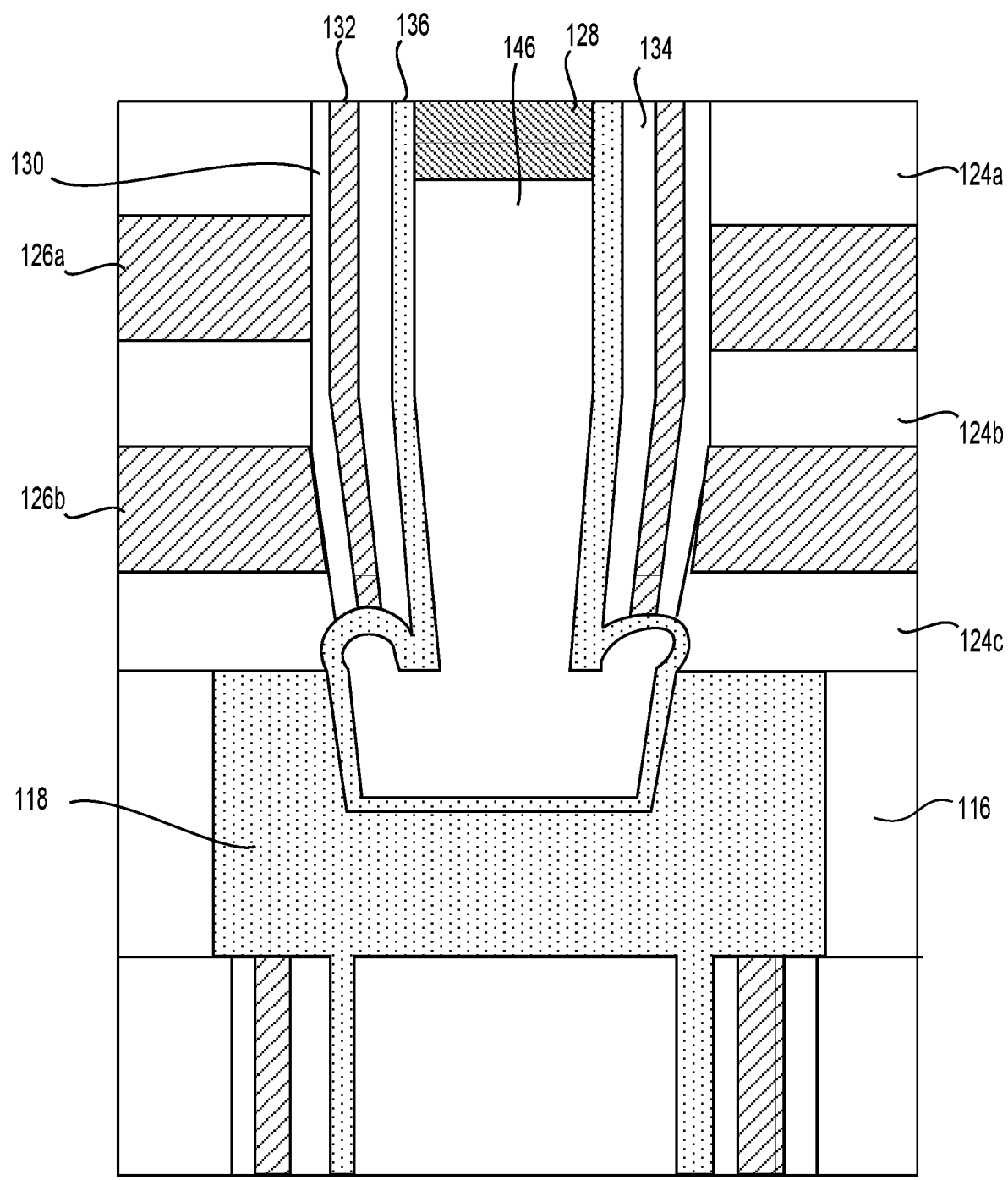

In FIG. 14, a surface planarization process (e.g., CMP) can be applied to remove any excessive channel contact layer 148 over the top surface of the uppermost second insulating layer 124a. When the surface planarization process is completed, the channel contact layer 148 that remains in the recessed portion of the second dielectric layer 146 forms a top channel contact 128 with a thickness from 20 nm to 100 nm. The top channel contact 128 can be electrically connected with a bit line thereafter. As shown in FIG. 14, a complete upper memory cell string is formed that is identical to the upper memory cell string of the memory cell string 100A illustrated in FIG. 1. The upper memory cell string is formed over the inter deck contact 118. The upper memory cell string can have a plurality of second word lines 126 and a plurality of second insulating layers 124. A second channel structure is formed in the second word lines 126 and second insulating 124. The second channel structure vertically extends into the inter deck contact and further laterally extends into the second insulating layers. The second channel dielectric region of the second channel structure is above a top surface of the inter deck contact 118.

Figure 15:
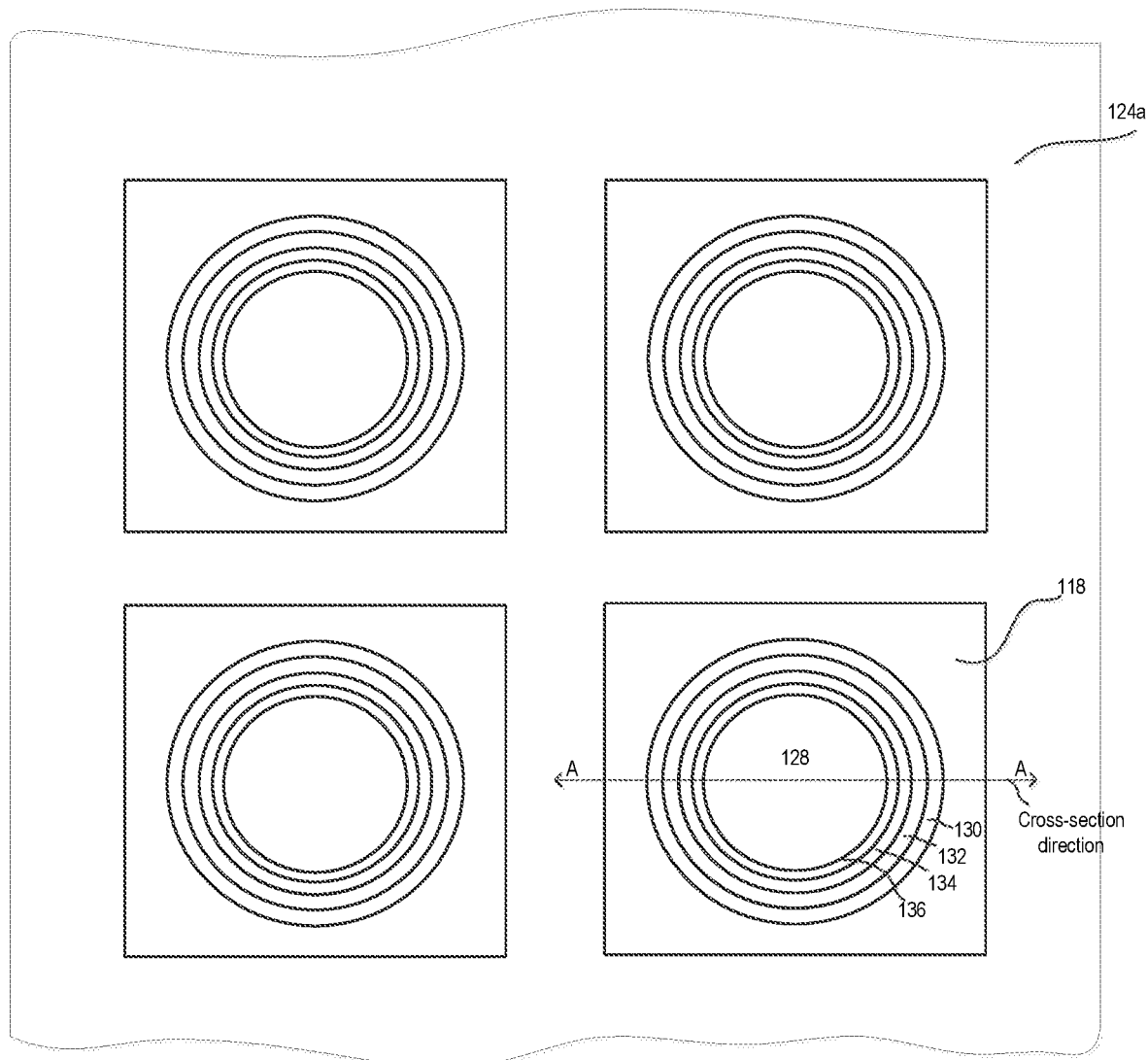

FIG. 15 is a top down view of a 3D NAND memory device 100, in accordance with some embodiments of the present disclosure. As shown in FIG. 15, the 3D NAND memory device can have a plurality of second channel structures. Each of the plurality of second channel structures can be formed over a respective inter deck contact. The second channel structure can have a circular pillar-shape and the inter deck contact can have a cube-shape. However, the present disclosure is not limited thereto, and the channel structure may have a square pillar-shape, an oval pillar-shape, or other suitable shapes. The inter deck contact may have a cuboid-shape, a cylinder shape, or other suitable shapes. Each of the plurality of the second channel structures can have a second blocking layer (e.g., layer 130) formed along the sidewalls of the respective second channel structure, a second charge storage layer (e.g., 132) formed along the second blocking layer, a second tunneling layer (e.g., 134) formed along the second charge storage layer, a second channel layer (e.g., 136) formed along the second tunneling layer, and a top channel contact (e.g., 128) that is in direct contact with the second channel layer. In the 3D NAND memory device disclosed in FIG. 15, top surfaces of the second channel layer (e.g., 136), the second tunneling layer (e.g., 134), the second charge storage layer (e.g., 132), the second blocking layer (e.g., 130), the top channel contact (e.g., 128), and the uppermost second insulating layer (e.g., 124a) are coplanar.

Figure 16:
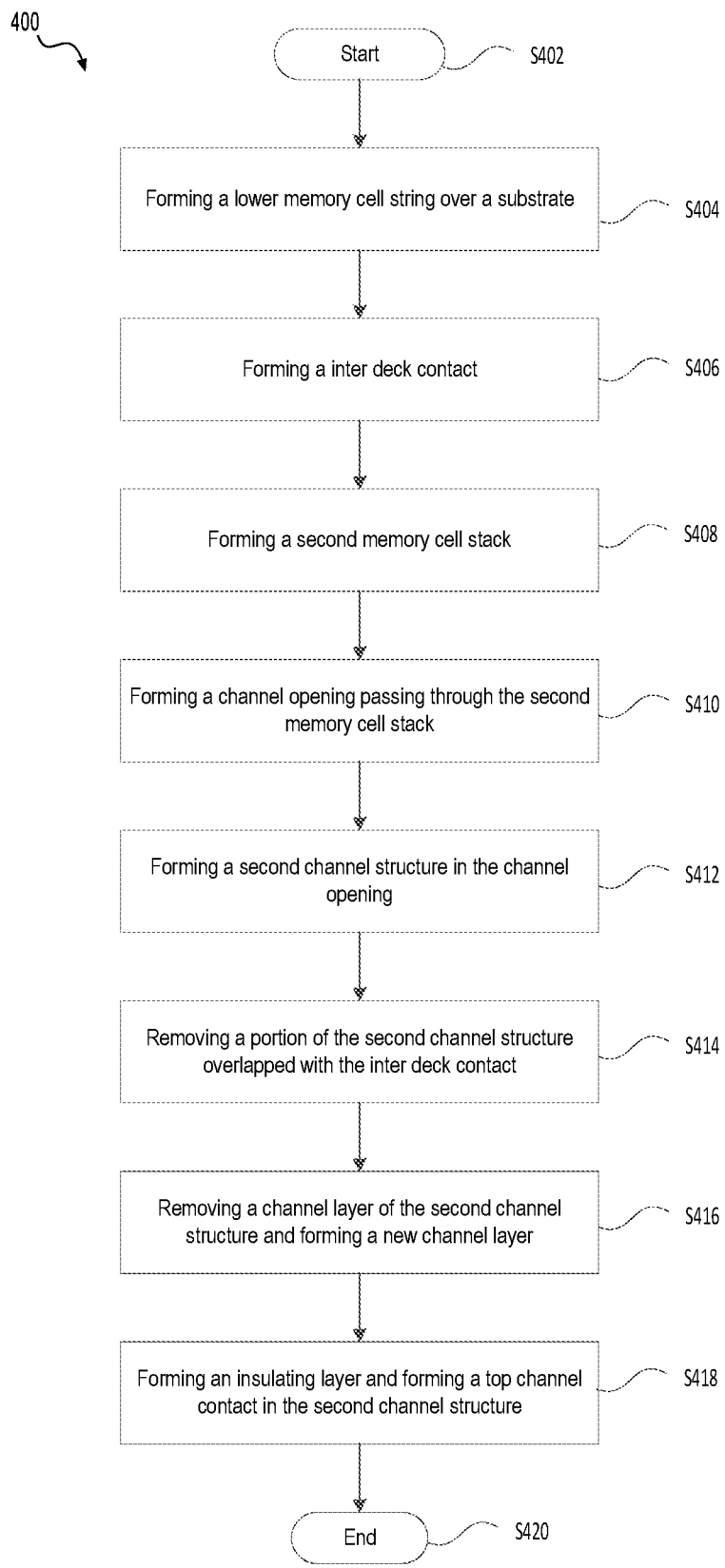
FIG. 16 is a flowchart of a process for manufacturing a 3D NAND memory device in accordance with some embodiments.

FIG. 16 is a flowchart of a process 400 for manufacturing a 3D NAND memory device in accordance with some embodiments. The process 400 begins at step 404 where a lower memory cell string over a substrate is formed. The lower memory cell string can have a first memory cell stack that includes a plurality of first word lines and a plurality of first insulating layers. A first channel structure passes through the first word lines and the first insulating layers and vertically protrudes from the surface of the substrate. The first word line layers and the first insulating layers are alternatively stacked along sidewalls of the first channel structure. The process 400 then proceeds to step 406 where an inter deck contact is formed over the top surface of the lower memory cell string and the inter deck contact is connected with the first channel structure. The semiconductor structure may be substantially similar to the semiconductor structure 300 discussed above with reference to FIG. 3.

The process 400 then proceeds to step 408 where a second memory cell stack over the inter deck contact. The second memory cell stack includes a plurality of second insulating layers and a plurality of second word lines. The second insulating layers and the second word lines are alternatively stacked, uppermost and lowermost layers of the second memory stack are the second insulating layers. In some embodiments, step 408 can be performed as illustrated with reference to FIG. 4.

The process 400 proceeds to step 410 where a channel opening is formed in the second memory stack. The channel opening passes through the second memory cell stack. The channel opening has sidewalls and a bottom portion to expose the inter deck contact and extend into the inter deck contact by recessing a part of the inter deck contact. In some embodiment, step 410 can be performed as illustrated with reference to FIG. 5.

In step 412 of the process 400, a second channel structure is formed in the channel opening. Firstly, a blocking layer is formed along the sidewalls of the channel opening and over the inter deck contact, and the blocking layer covers a top surface of the second memory cell stack. A charge storage layer is formed over the blocking layer in the channel opening, and a tunneling layer is formed over the charge storage layer in the channel opening. A channel layer is subsequently formed over the tunneling layer in the channel opening where the channel layer has sidewalls and a bottom portion. A protective layer is formed over the channel layer in the channel opening and the protective layer has sidewalls and a bottom portion. In some embodiments, step 412 can be performed as illustrated with reference to FIG. 6.

The process 400 then proceeds to step 414. In step 414, the bottom portion of the protective layer in the channel opening is firstly removed to expose the bottom portion of the channel layer, and the bottom portion of the channel layer is subsequently recessed. The bottom portion and a part of sidewalls of the channel layer adjacent to the bottom portion are removed in the channel opening. When the removal is completed, a bottom end of the channel layer is above a top surface of the inter deck contact. The protective layer, the bottom portions and a part of the sidewalls of the blocking layer, the charge storage layer, and the tunneling layer in the overlapping region of the channel opening and the inter deck contact are further removed. Upon the completion of the removal, bottom ends of the blocking layer, the charge storage layer, and the tunneling layer are above the top surface of the inter deck contact. In some embodiments, step 414 can be performed as illustrated with reference to FIGS. 7-9.

The process 400 then proceeds to step 416 where the channel layer is removed fully and a new channel layer is formed thereafter. The new channel layer is formed along the sidewalls of the channel opening and over the inter deck contact. In some embodiment, step 416 can be performed as illustrated with reference to FIGS. 10-11.

The process 400 proceeds to step 418 where a dielectric layer is formed and a top channel contact is formed in the second channel structure. In step 418, the dielectric layer is firstly formed over the new channel layer to fill the channel opening. A top portion of the dielectric layer along the new channel layer is subsequently recessed. The recessed top portion of the dielectric layer is filled with a channel contact layer, and the channel contact layer covers the top surface of the second memory cell stack. A surface planarization process is then performed to remove any excessive channel contact layer over the top surface of the second memory cell stack to form a top channel contact. The top channel contact is in direct contact with the new channel layer, and a top surface of the top channel contact and the top surface of the second memory cell stack are coplanar. In some embodiments, step 418 can be performed as illustrated with reference to FIGS. 12-14.

It should be noted that additional steps can be provided before, during, and after the process 400, and some of the steps described can be replaced, eliminated, or performed in different order for additional embodiments of the process 400. In subsequent process steps, various additional interconnect structures (e.g., metallization layers having conductive lines and/or vias) may be formed over the semiconductor device 100. Such interconnect structures electrically connect the semiconductor device 100 with other contact structures and/or active devices to form functional circuits. Additional device features such as passivation layers, input/output structures, and the like may also be formed.

The various embodiments described herein offer several advantages over related examples. For example, in the related examples, additional parasitic capacitors are formed in the overlapping region between the channel structure and the inter deck contact. Due to the existence of the additional parasitic capacitors, less voltage is coupled to a part of the charge storage layer in the overlapping region. The lower amount of voltage coupled to the charge storage layer may not be able to invert a part of the channel layer in the overlapping region to form an inversion layer. The consequence of the failure to form an inversion layer in the channel layer is high channel resistance. In the present disclosure, a novel 3D NAND memory device and a method of forming the same are provided. In the disclosed 3D NAND memory device, a blocking layer, a charge storage layer, and a tunneling layer in the overlapping region between the channel structure and the inter deck contact are removed and the formation of additional parasitic capacitors are prevented. Consequently, more voltage can be coupled to the charge storage layer so as to invert the adjacent channel layer in the overlapping region to reduce the channel resistance during operation.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A three-dimensional memory device, comprising:
an interconnect structure; and
a first deck formed over the interconnect structure, the first deck including a
first stack of alternating first insulating layers and first word line layers over the interconnect structure, and a first channel structure extending through the first stack, the first channel structure having sidewalls and a bottom portion that vertically extends into a recess of the interconnect structure, the first channel structure having a first channel dielectric region and a first channel layer including side portions and a bottom portion, wherein:
the first channel dielectric region is formed along the sidewalls of the first channel structure, positioned over a top surface of the interconnect structure, and in contact with the first insulating layers and the first word line layers,
the side portions of the first channel layer are formed along the first channel dielectric region, and include a rounded projection that extends away from the top surface of the interconnect structure, extends outwards into the first stack to form a curved interface with the first stack at an interface of the interconnect structure, the first channel structure and the first stack, and is positioned between the first channel dielectric region and the bottom portion of the first channel layer, and the bottom portion of the first channel layer is formed along the recess of the interconnect structure and in contact with the interconnect structure.

2. The three-dimensional memory device of claim 1, wherein:

the first channel dielectric region is positioned on the rounded projection of the side portions of the first channel layer.

3. The three-dimensional memory device of claim 1, wherein:

the side portions of the first channel layer further comprises a tapered structure that is formed along the first channel dielectric region, and the rounded projection is positioned between the tapered structure and the bottom portion of the first channel layer.

4. The three-dimensional memory device of claim 3, wherein:

a top of the rounded projection is positioned above a bottom of the tapered structure.

5. The three-dimensional memory device of claim 2, wherein the first channel dielectric region comprises:

a first blocking layer formed along the sidewalls of the first channel structure, the first blocking layer being in contact with the first insulating layers and the first word line layers and positioned on the rounded projection of the side portions of the first channel layer, a first charge storage layer formed along the first blocking layer and positioned on the rounded projection of the side portions of the first channel layer, and a first tunneling layer formed along the first charge storage layer and positioned on the rounded projection of the side portions of the first channel layer.

6. The three-dimensional memory device of claim 1, wherein the rounded projection extends outwards into a lowermost insulating layer of the first insulating layers in the first stack.

7. The three-dimensional memory device of claim 1, wherein the first channel structure further comprises:

a first dielectric layer formed over the first channel layer in the first channel structure, and extending into the interconnect structure; and a first channel contact formed along the first channel layer and positioned over the first dielectric layer.

8. The three-dimensional memory device of claim 1, further comprising:

a substrate; and a second deck positioned between the substrate and the interconnect structure, the second deck including a second stack of alternating second insulating layers and second word line layers over the substrate, and a second channel structure extending through the second stack, the second channel structure having sidewalls and a bottom portion that vertically extends into the substrate.

9. The three-dimensional memory device of claim 8, wherein the second channel structure further comprises:

a second channel contact positioned at the bottom portion of the second channel structure and extending into the substrate;

a second blocking layer formed along the sidewalls of the second channel structure and arranged between the second channel contact and the interconnect structure, the second blocking layer being in contact with the second insulating layers and the second word line layers;

a second charge storage layer formed along the second blocking layer and arranged between the second channel contact and the interconnect structure;

a second tunneling layer formed along the second charge storage layer and arranged between the second channel contact and the interconnect structure;

a second channel layer formed along the second tunneling layer and arranged between the second channel contact and the interconnect structure, the second channel layer being connected with the interconnect structure; and a second dielectric layer formed along the second channel layer and arranged between the second channel contact and the interconnect structure.

10. The three-dimensional memory device of claim 9, wherein the first channel structure and the second channel structure have a pillar-shape.

* * * * *